United States Patent
Kim et al.

(10) Patent No.: US 8,324,049 B2
(45) Date of Patent: Dec. 4, 2012

(54) SEMICONDUCTOR DEVICE AND METHOD FOR FABRICATING THE SAME

(75) Inventors: Jin-A Kim, Gyeonggi-do (KR); Seok-Ho Jie, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 348 days.

(21) Appl. No.: 12/641,073

(22) Filed: Dec. 17, 2009

(65) Prior Publication Data

US 2011/0101499 A1    May 5, 2011

(30) Foreign Application Priority Data

Oct. 30, 2009   (KR) .................. 10-2009-0104677

(51) Int. Cl.
*H01L 21/8242*   (2006.01)
(52) U.S. Cl. .................... 438/254; 438/397
(58) Field of Classification Search .............. None
See application file for complete search history.

(56) References Cited

U.S. PATENT DOCUMENTS

2003/0232483 A1*  12/2003  Fujiishi ............. 438/396

FOREIGN PATENT DOCUMENTS

| JP | 2002-076142 | 3/2002 |
| JP | 2009-253208 | 10/2009 |
| KR | 1020080088679 | 10/2008 |
| KR | 100885922 | 2/2009 |

OTHER PUBLICATIONS

Notice of Preliminary Rejction issued from Korean Intellectual Property Office on Jun. 8, 2011.
Notice of Allowance issued by the Korean Intellectual Property Office on Mar. 27, 2012.

* cited by examiner

*Primary Examiner* — Benjamin Sandvik
*Assistant Examiner* — Scott R Wilson
(74) *Attorney, Agent, or Firm* — IP & T Group LLP

(57) ABSTRACT

A semiconductor device and a method for fabricating a semiconductor device are provided. The method for fabricating a semiconductor device includes forming an isolation layer over a semiconductor substrate defining first and second regions, etching the isolation layer at an edge of the first region to form a guard ring pattern, forming a buried guard ring filling the guard ring pattern, selectively etching the isolation layer of the first region to form a plurality of patterns, forming a plurality of conductive patterns in the respective patterns, and completely removing the isolation layer of the first region through a dip-out process.

17 Claims, 20 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2009-0104677, filed on Oct. 30, 2009, which is incorporated herein by reference in its entirety.

BACKGROUND OF THE INVENTION

Exemplary embodiments of the present invention relate to a semiconductor device and a method for fabricating the same; and, more particularly, to a semiconductor device, which has a floating layer with a portion serving as a guard ring surrounding a cell region, and a method for fabricating the same.

As the design rule of semiconductor devices decreases, there have been difficulties in securing capacitance of capacitors. To secure the capacitance, capacitors with a cylinder structure have been introduced, which may extend an effective area.

To form such cylinder-structure capacitors, a dip-out process is performed. Conventionally, a full dip-out process has been performed to dip out a second region (peripheral circuit region and core region), as well as, a first region (cell region). Due to a step between the first and second regions, however, defects may occur in a contact process, such as a metal contact (M1C) process.

To solve such a problem, a process of dipping out only the first region is applied, instead of the full dip-out process.

FIGS. 1A to 1C are cross-sectional views illustrating a conventional method for fabricating a capacitor.

Referring to FIG. 1A, an interlayer dielectric layer 12 is formed on a substrate 11 defining first and second regions 101 and 102. The first region 101 may include a cell region, and the second region 102 may include a peripheral circuit region and a core region.

The interlayer dielectric layer 12 is etched using a storage node contact mask to form a plurality of storage node contact holes, and a plurality of storage node contact plugs (SNC) 13 are formed to be buried in the storage node contact holes and connected to the substrate 11 in the first region 101.

An etch stop layer 14 is formed on a resulting structure, including the SNCs 13, and the isolation layer 15 is formed on the etch stop layer 14.

The isolation layer 15 and the etch stop layer 14 at the first region are sequentially etched using a storage node mask to form a plurality of hole type patterns 16 exposing the SNCs 13.

Referring to FIG. 1B, a conductive layer is deposited over a resulting structure including the patterns 16, and an etch-back process is performed to form a plurality of storage nodes 17 in the respective patterns.

Referring to FIG. 1C, a mask 18 which covers the second region 102 and opens the first region 101 is formed, and a dip-out process 19 using a wet chemical is performed.

Accordingly, the isolation layer 15 is completely removed from the first region, and only the storage nodes 17 remain in the first region. Since the isolation layer 15 at the second region is protected by the mask 18, the isolation layer 15A remains.

In the conventional method, however, when the dip-out process 19 is performed, the wet chemical may permeate (refer to reference numeral 19A) into the second region, such that a bunker (refer to reference numeral B) is formed.

The bunker defect caused by the dip-out process frequently occurs in the guard ring region. The formed bunker, which is a device killing defect, causes a capacitor to fail at a probability of 100%. In a region other than the first region where the dip-out is process is performed, the region is damaged due to a poor guard ring and previous defects during the dip-out process. When M1Cs are formed in a subsequent process, a bridge between the M1Cs may occur causing a capacitor to fail.

SUMMARY OF THE INVENTION

An embodiment of the present invention is directed to a semiconductor device and a method for fabricating the same, which prevents a bunker from being formed in a region other than a cell region during a dip-out process.

In accordance with an embodiment of the present invention, a semiconductor device includes a semiconductor substrate defining a cell region and a peripheral circuit region, a plurality of storage nodes formed over the semiconductor substrate in the cell region, and a buried guard ring surrounding the cell region. The semiconductor device further includes a floating layer including a portion serving as the buried guard ring and supporting upper side walls of the storage nodes.

In accordance with another embodiment of the present invention, a method for fabricating a semiconductor device includes forming an isolation layer over a semiconductor substrate defining first and second regions, etching the isolation layer at an edge of the first region to form a guard ring pattern, forming a buried guard ring filling the guard ring pattern, selectively etching the isolation layer of the first region to form a plurality of patterns, forming a plurality of conductive patterns in the respective patterns, and completely removing the isolation layer of the first region through a dip-out process.

In accordance with yet another embodiment of the present invention, a method for fabricating a semiconductor device includes forming an isolation layer over a semiconductor substrate defining a cell region and a peripheral circuit region, etching the isolation layer at an edge of the cell region to form a guard ring pattern, forming a floating layer over the isolation layer, the floating layer having a portion which is buried in the guard ring pattern to serve as a guard ring, selectively etching the floating layer and the isolation layer of the cell region to form a plurality of storage node patterns, forming a plurality of storage nodes in the respective storage node patterns, and completely removing the isolation layer of the cell region through a dip-out process.

DESCRIPTION OF SPECIFIC EMBODIMENTS

Figure 1A:
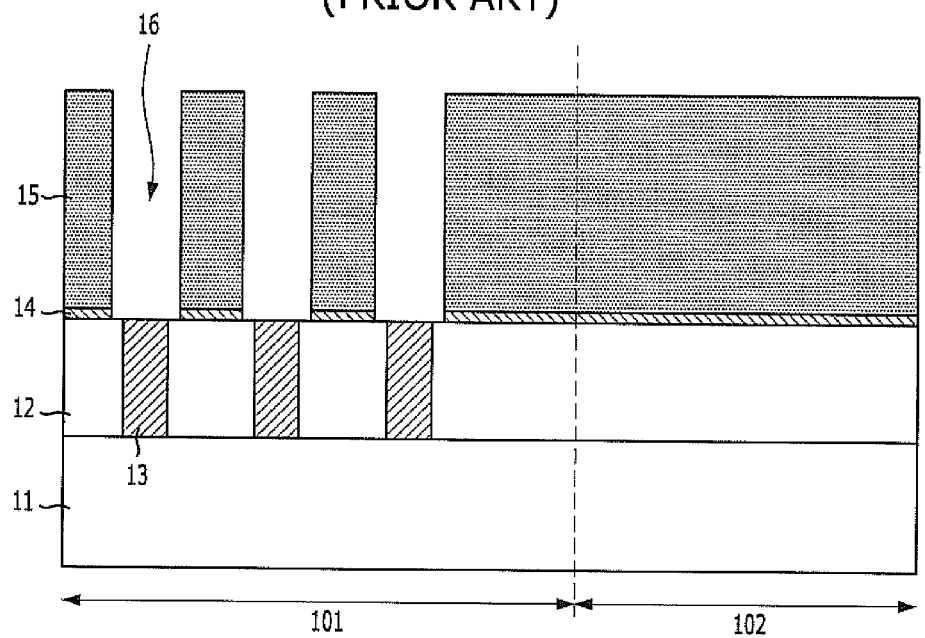
FIGS. 1A to 1C are cross-sectional views illustrating a conventional method for fabricating a semiconductor device.
Figure 1B:
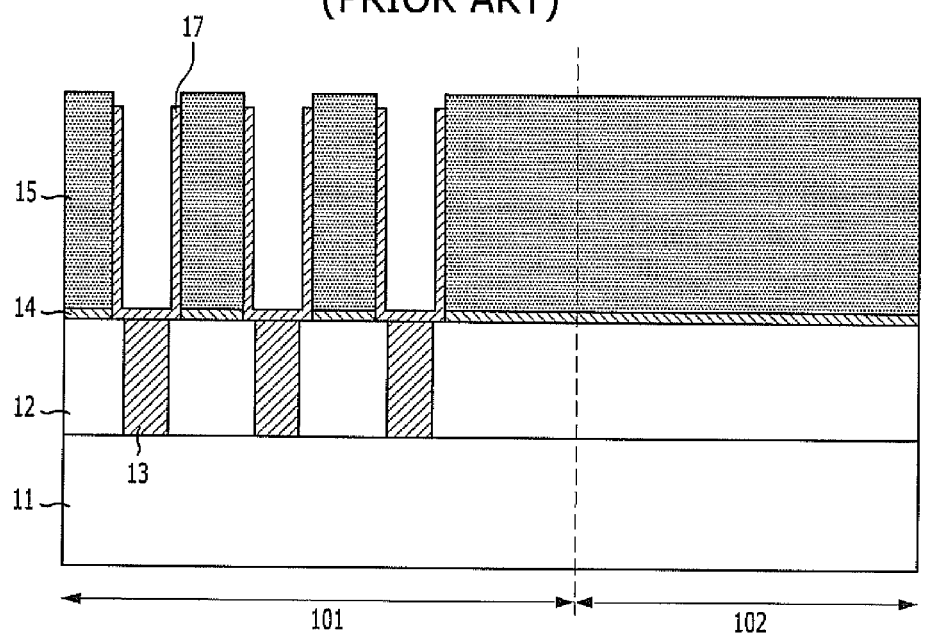
Figure 1C:
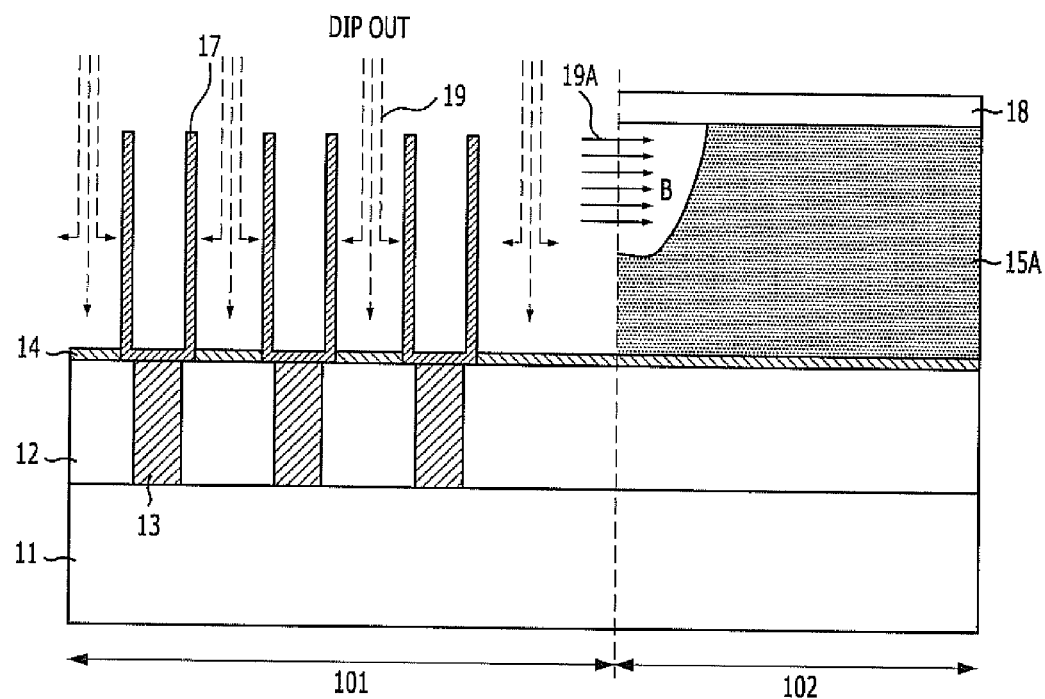

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various Figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIGS. 2A to 2E are cross-sectional views illustrating a method for fabricating a semiconductor device in accordance with a first embodiment of the present invention.

Figure 2A:
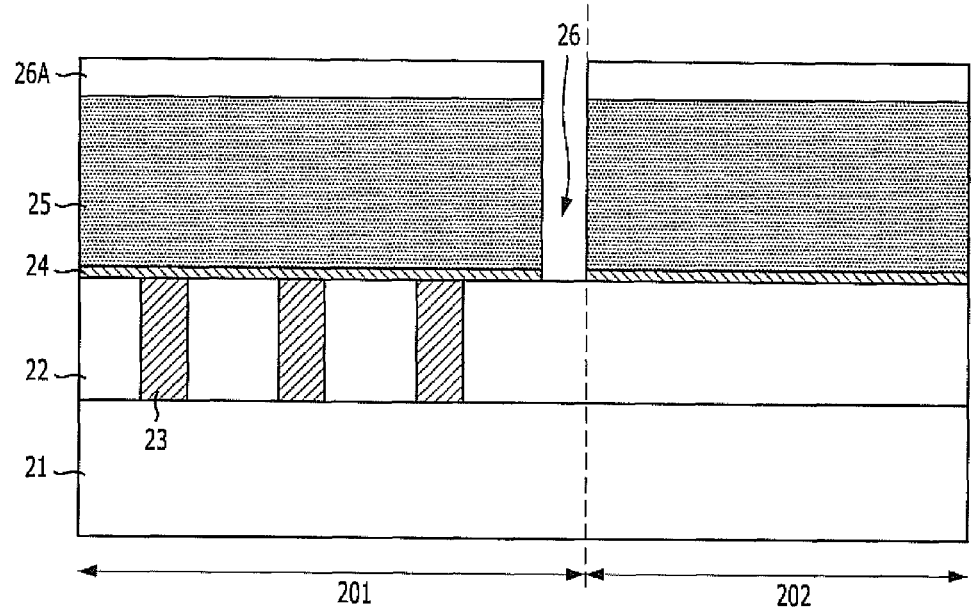
FIGS. 2A to 2E are cross-sectional views illustrating a method for fabricating a semiconductor device in accordance with a first embodiment of the present invention.

Referring to FIG. 2A, an interlayer dielectric layer 22 is formed on a semiconductor substrate 21 defining first and second regions 201 and 202. The first region 201 may include a cell region of a memory device, and the second region 202 may include a peripheral circuit region and a core region of the memory device.

A plurality of contact plugs 23 are formed in the first region 201, so as to pass through the interlayer dielectric layer 22. The contact plugs 23 may include landing plugs or storage node contact plugs (SNC). Although not shown, when the contact plugs 23 are SNCs, a process of forming a transistor, including a word line, and a process of forming a bit line may typically be performed before the interlayer dielectric layer 22 is formed. The interlayer dielectric layer 22 is formed of an oxide layer. The contact plugs 23 are formed as follows: the interlayer dielectric layer 22 is etched using a contact mask to form a plurality of contact holes, and a conductive layer, such as a polysilicon layer, is deposited and etched back to form the contact plugs 23.

An etch stop layer 24 is formed on the interlayer dielectric layer 22 having the contact plugs 23 buried therein. The etch stop layer 24 serves to stop etching when an isolation layer is etched. The etch stop layer 24 is formed of silicon nitride ($Si_3N_4$) to a thickness of approximately 50 Å to approximately 2,000 Å.

An isolation layer 25 is formed on the etch stop layer 24. The isolation layer 25 is formed of an insulation layer. In particular, an oxide layer is deposited to such a thickness that an area required for desirable charge capacity may be secured. The isolation layer 25 may be formed of an oxide layer, such as Boro Phosphorous Silicate Glass (BPSG), Phosphorous Silicate Glass (PSG), Tetra Ethyl Ortho Silicate (TEOS), Undoped Silicate Glass (USG), or High Density Plasma oxide (HDP). The isolation layer may have a thickness of approximately 100 Å to approximately 15,000 Å. After the isolation layer 25 is formed, planarization may be performed by Chemical Mechanical Polishing (CMP), dry etching, or wet etching. The planarization thickness may range from approximately 50 Å to approximately 5,000 Å.

The isolation layer 25 and the etch stop layer 24 are selectively dry-etched using a guard ring mask 26A to form a guard ring pattern 26. That is, the isolation layer 25 and the etch stop layer 24 are sequentially in the first region 201 where the first region 201 borders the second region 202 to form the guard ring pattern 26. The guard ring pattern 26 is a ring-type trench isolating the isolation layer 25 on the first region 201 from the isolation layer 25 on the second region 202.

When the guard ring pattern 26 is formed using the guard ring mask 26A, i-line, KrF, or ArF (immersion) may be used as an exposure source. When the etching is performed, gases, including $C_xF_y$ (for example, $C_4F_8$), $C_xF_yCl_z$ (x ranges from 2 to 7; y ranges from 1 to 12; z ranges from 0 to 8; and y+z=2x−2), $O_2$, $O_3$ and so on, may be used independently or together.

Figure 2B:
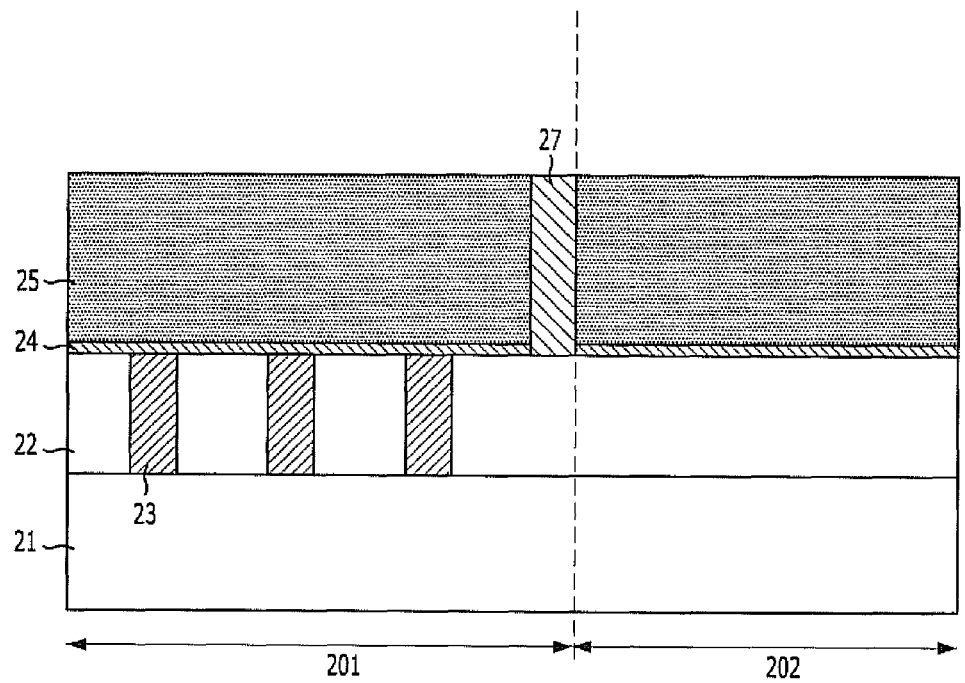

Referring to FIG. 2B, a buried guard ring 27 is formed to be buried in the guard ring pattern 26 after the guard ring mask 26A is removed. To form the buried guard ring 27, an insulation layer is deposited on the isolation layer 25 until the guard ring pattern 26 is completely filled, and an etching back or CMP process may be performed.

At this time, the buried guard ring 27 includes a material which is not removed during a subsequent dip-out process. The buried guard ring 27 may include an insulation layer, or particularly a nitride layer. For example, a silicon nitride layer ($Ni_3N_4$) or silicon oxide nitride layer (SiON) may be used as the buried guard ring 27. The buried guard ring 27 is formed to a thickness of approximately 50 Å to approximately 3,000 Å depending on the thickness and width of the guard ring pattern 26.

As such, since the buried guard ring 27 is formed to be buried in the guard ring pattern 26, the buried guard ring 27 isolates the isolation layer 25 on the first region 201 from the isolation layer 25 on the second region 202.

Figure 2C:
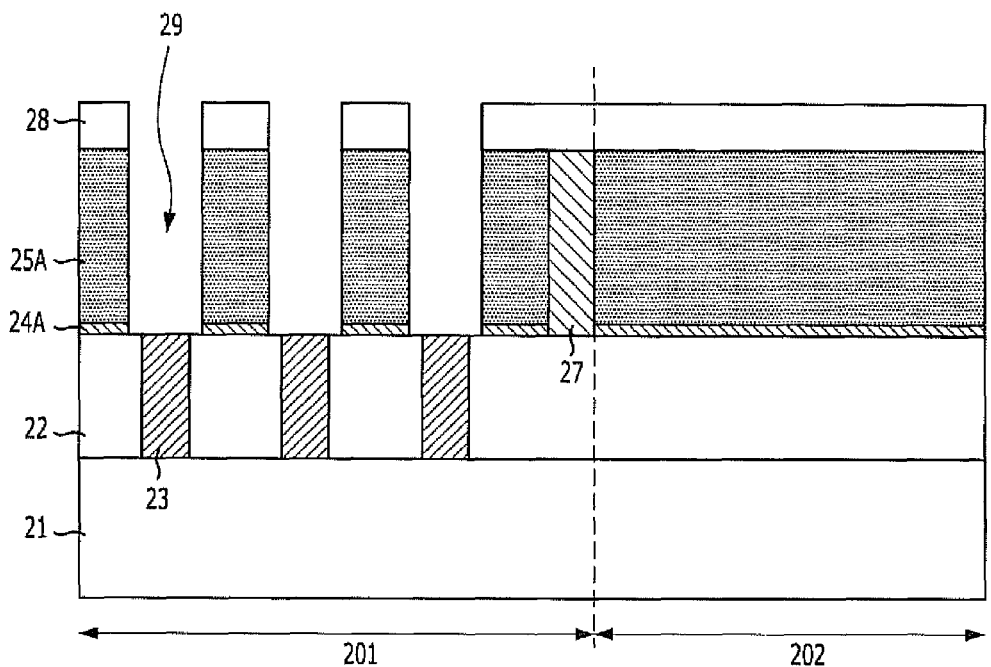

Referring to FIG. 2C, a photoresist is applied onto the isolation layer 25 having the buried guard ring 27 formed therein and then patterned by exposure and development to form a mask 28 for selectively forming patterns in the first region 201.

The isolation layer 25 is etched using the mask 28 as an etching barrier, such that the etching is stopped at the etch stop layer 24. After the isolation layer 25 is etched, the etch stop layer 24 is etched to form a plurality of patterns 29 exposing the respective contact plugs 23. The patterns 29 are formed in the multilayer structure, including the etch stop layer 24A and the isolation layer 25A. When the patterns 29 are formed, the buried guard ring 27 is not etched. When the contact plugs 23 include SNCs, the patterns 29 become storage node patterns. In this case, the patterns 29 may have a hole shape. Furthermore, when the contact plugs 23 are landing plugs, the patterns 29 may become contact holes.

Figure 2D:
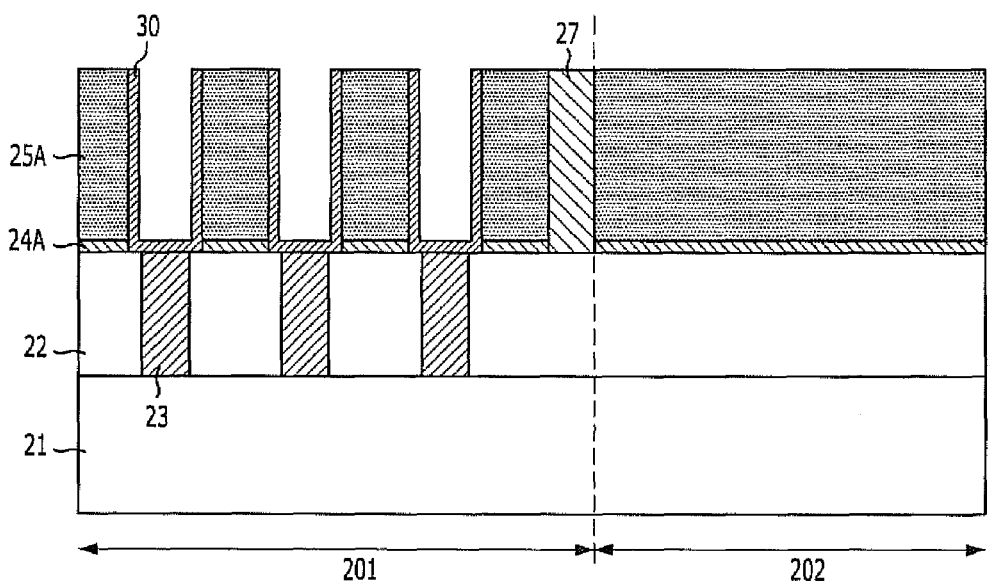

Referring to FIG. 2D, a plurality of cylinder-type conductive patterns 30 are formed in the respective patterns 29, after the mask 28 is removed. When the contact plugs 23 include SNCs, the conductive patterns 30 become cylinder-type storage nodes. Furthermore, when the contact plugs 23 are landing plugs, the conductive patterns 30 may become bit-line contact plugs or SNCs.

The conductive patterns 30 are performed as follows. A conductive layer is deposited over a resulting structure including the patterns 29 and then etched back to form the conductive patterns 30. The conductive layer used for the conductive patterns 30 is formed of any one of a metal nitride layer, a metal layer, and a combination of metal nitride layer and metal layer. For example, at least any one of TiN, Ru, TaN, WN, Pt, and Ir may be used.

Figure 2E:
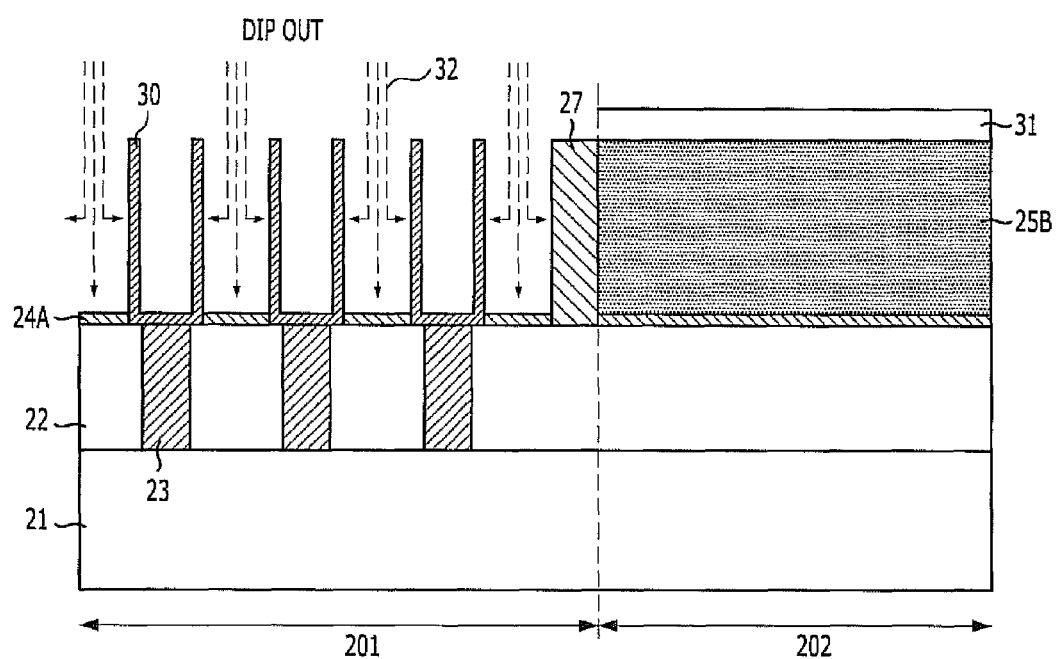

Referring to FIG. 2E, a photoresist is applied and then exposed and developed to form a first region open mask 31, which covers the second region 202 and opens the first region 201. After the first region open mask 31 is formed, a dip-out process 32 is performed.

During the dip-out process 32, the isolation layer is entirely removed in the first region 201, but remains in the second region 202.

A wet dip-out process is applied as the dip-out process 32. Since the isolation layer 25 is an oxide layer, a wet chemical such as hydrofluoric acid or Buffered Oxide Etchant (BOE) solution capable of wet-etching an oxide layer may be used in the wet dip-out process. At this time, since the buried guard ring 27 includes a nitride layer, the buried guard ring 27 is not removed during the wet dip-out process.

During the dip-out process 32, the buried guard ring 27 is not etched, but remains to prevent the wet chemical from flowing into the second region 202. Accordingly, a bunker is not formed in the second region 202 during the dip-out process 32.

Figure 2F:
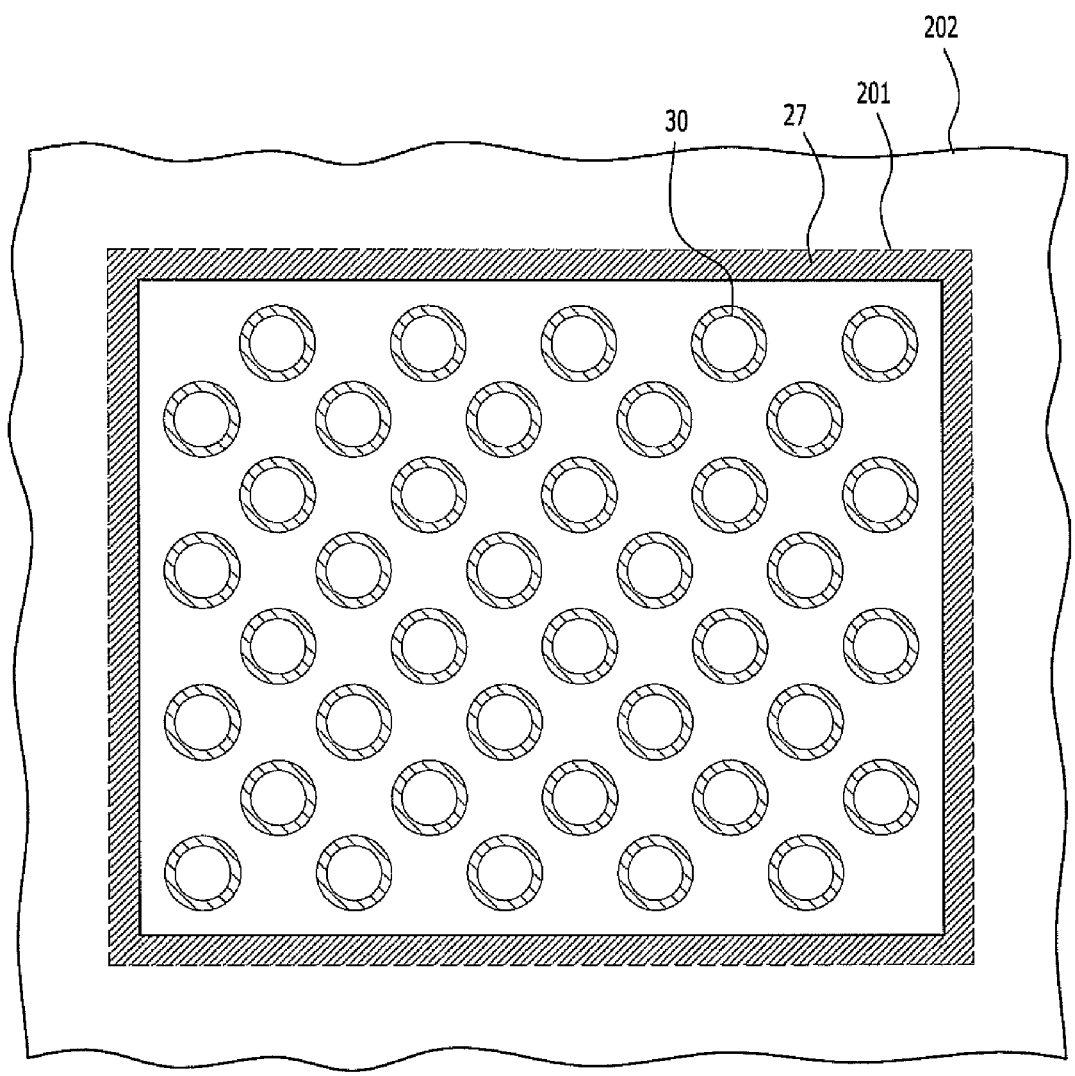
FIG. 2F is a plan view of the semiconductor device in accordance with the first embodiment of the present invention.

FIG. 2F is a plan view of the semiconductor device according to the first embodiment of the present invention, showing a state of the semiconductor device in which the buried guard ring 27 surrounds the edge of the first region 201 having the plurality of conductive patterns 30 formed therein. As such, since the buried guard ring 27 surrounds the first region 201, a bunker is not formed in the second region 202 during the dip-out process.

The embodiment of the present invention may also be applied to a semiconductor device adopting pillar-type conductive patterns.

FIGS. 3A to 3E are cross-sectional views illustrating a method for fabricating a semiconductor device according to a second embodiment of the present invention. All components, excluding conductive patterns 30A, are the same as those of the first embodiment.

Figure 3A:
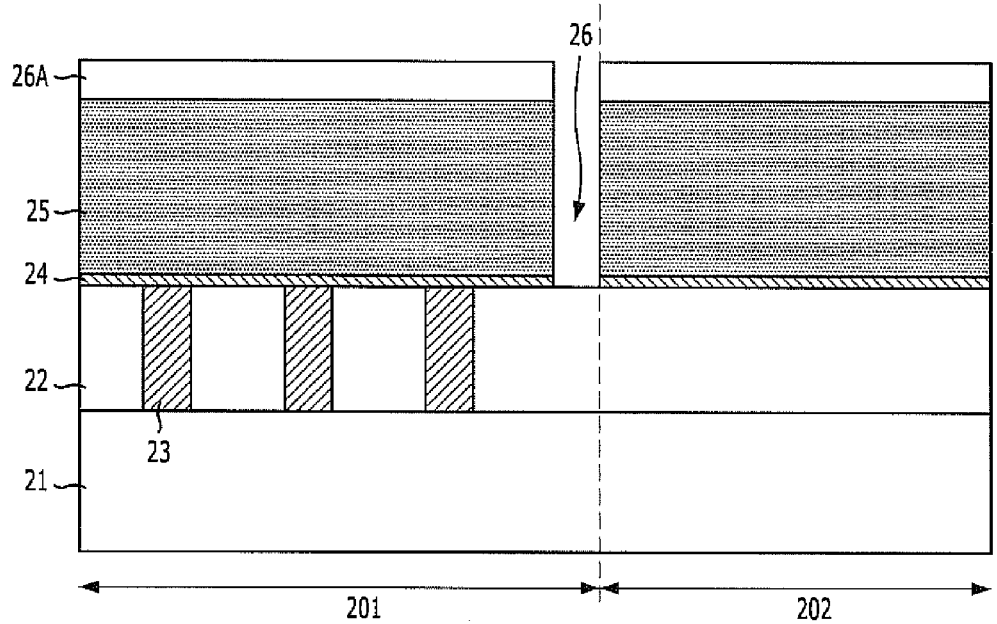
FIGS. 3A to 3E are cross-sectional views illustrating a method for fabricating a semiconductor device in accordance with a second embodiment of the present invention.

Referring to FIG. 3A, an interlayer dielectric layer 22 is formed on a semiconductor substrate 21 defining first and second regions 201 and 202. The first region 201 may include a cell region of a memory device, and the second region 202 may include a peripheral circuit region and a core region of the memory device.

A plurality of contact plugs 23 are formed in the first region 201 to pass through the interlayer dielectric layer 22. The contact plugs 23 may include landing plugs or SNCs. Although not shown, when the contact plugs 23 are SNCs, a process of forming a transistor, including a word line, and a process of forming a bit line may typically be performed before the interlayer dielectric layer 22 is formed. The interlayer dielectric layer 22 is formed of an oxide layer. The contact plugs 23 are formed as follows. The interlayer dielectric layer 22 is etched using a contact mask to form a plurality of contact holes, and a conductive layer, such as a polysilicon layer, is deposited and etched back to form the contact plugs 23.

An etch stop layer 24 is formed on the interlayer dielectric layer 22 having the contact plugs 23 buried therein. The etch stop layer 24 serves to stop etching when an isolation layer is etched. The etch stop layer 24 is formed of silicon nitride ($Si_3N_4$) to a thickness of approximately 50 Å to approximately 2,000 Å.

An isolation layer 25 is formed on the etch stop layer 24. The isolation layer 25 is formed of an insulation layer. In particular, an oxide layer is deposited to such a thickness that an area required for desirable charge capacity may be secured. The isolation layer 25 may be formed of an oxide layer, such as BPSG, PSG, TEOS, USG, or HDP. The isolation layer may have a thickness of approximately 100 Å to approximately 15,000 Å. After the isolation layer 25 is formed, planarization may be performed by CMP, dry etching, or wet etching. The planarization thickness may range from approximately 50 Å to approximately 5,000 Å.

The isolation layer 25 and the etch stop layer 24 are selectively dry-etched using a guard ring mask 26A to form a guard ring pattern 26. That is, the isolation layer 25 and the etch stop layer 24 are sequentially etched in the first region 201 where the first region 201 borders the second region 202 to form the guard ring pattern 26. The guard ring pattern 26 is a ring-type trench isolating the isolation layer 25 on the first region 201 from the isolation layer 25 on the second region 202.

When the guide ring pattern 26 is formed using the guard ring mask 26A, i-line, KrF, or ArF (immersion) may be used as an exposure source. When the etching is performed, gases, including $C_xF_y$ (for example, $C_4F_8$), $C_xF_yCl_z$ (x ranges from 2 to 7; y ranges from 1 to 12; z ranges from 0 to 8; and y+z=2x−2), $O_2$, $O_3$ and so on, may be used independently or together.

Figure 3B:
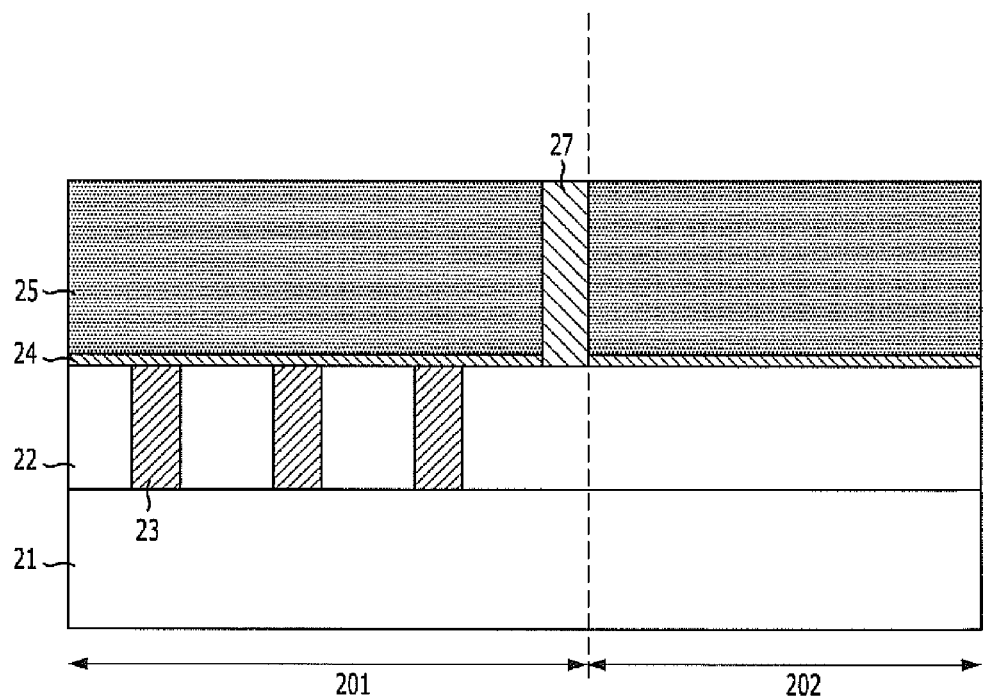

Referring to FIG. 3B, a buried guard ring 27 is formed to be buried in the guard ring pattern 26 after the guard ring mask 26A is removed. To form the buried guard ring 27, an insulation layer is deposited on the isolation layer 25 until the guard ring pattern 26 is completely filled, and an etching back or CMP process may be performed.

At this time, the buried guard ring 27 includes a material which is not removed during a subsequent dip-out process. The buried guard ring 27 may include an insulation layer, or particularly a nitride layer. For example, a silicon nitride layer ($Ni_3N_4$) or silicon oxide nitride layer (SiON) may be used as the buried guard ring 27. The buried guard ring 27 is formed to a thickness of approximately 50 Å to approximately 3,000 Å depending on the thickness and width of the guard ring pattern 26.

As such, since the buried guard ring 27 is formed to be buried in the guard ring pattern 26, the buried guard ring 27 isolates the isolation layer 25 on the first region 201 from the isolation layer 25 on the second region 202.

Figure 3C:
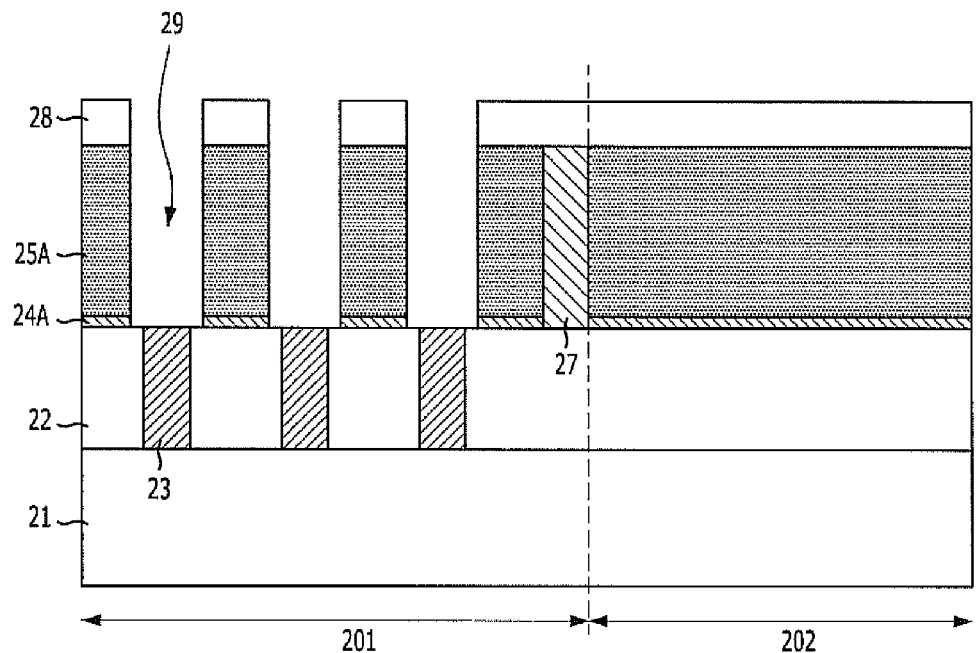

Referring to FIG. 3C, a photoresist is applied onto the isolation layer 25 having the buried guard ring 27 formed therein and then patterned by exposure and development to form a mask 28 for selectively forming patterns in the first region 201.

The isolation layer 25 is etched using the mask 28 as an etching barrier, such that the etching is stopped at the etch stop layer 24. After the isolation layer 25 is etched, the etch stop layer 24 is etched to form a plurality of patterns 29 exposing the respective contact plugs 23. The patterns 29 are formed in the multilayer structure, including the etch stop layer 24A and the isolation layer 25A. When the patterns 29 are formed, the buried guard ring 27 is not etched. When the contact plugs 23 include SNCs, the patterns 29 become storage node patterns. In this case, the patterns 29 may have a hole shape. Furthermore, when the contact plugs 23 are landing plugs, the patterns 29 may become contact holes.

Figure 3D:
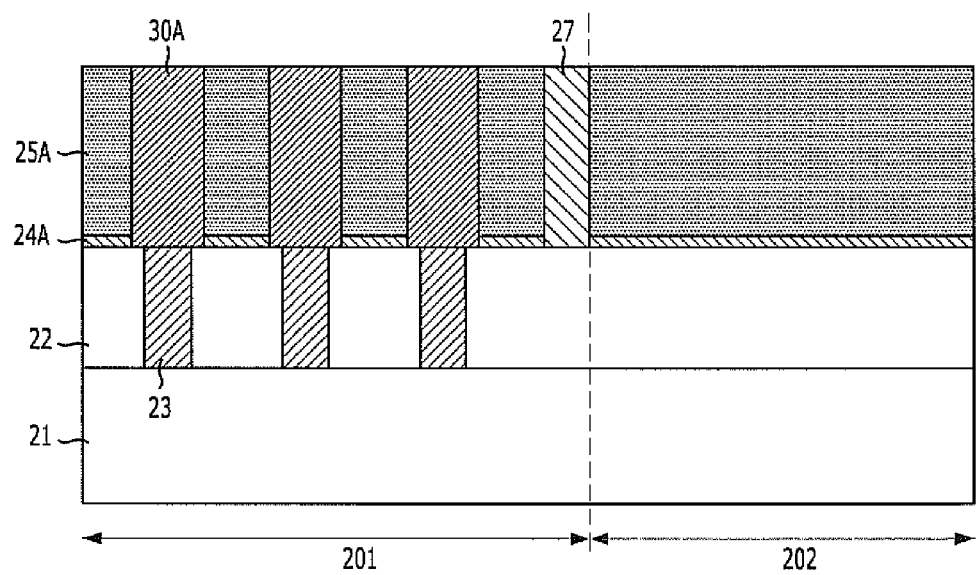

Referring to FIG. 3D, a plurality of pillar-type conductive patterns 30A are formed in the respective patterns 29, after the mask 28 is removed. When the contact plugs 23 include SNCs, the conductive patterns 30A become storage nodes. Furthermore, when the contact plugs 23 are landing plugs, the conductive patterns 30A may become bit-line contact plugs or SNCs.

The conductive patterns 30A are formed as follows. A conductive layer is deposited over a resulting structure to fill the patterns 29 and then etched back to form the conductive patterns 30A. The conductive layer used for the conductive patterns 30A is formed of any one of a metal nitride layer, a metal layer, and a combination of metal nitride layer and metal layer. For example, at least any one of TIN, Ru, TaN, WN, Pt, and Ir may be used.

Figure 3E:
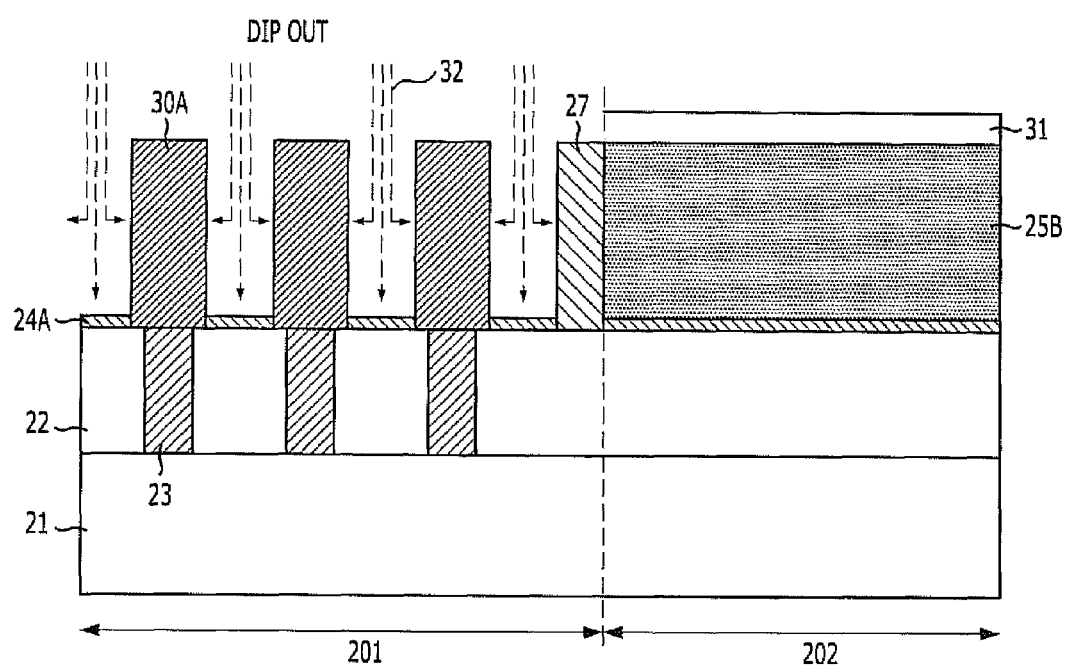

Referring to FIG. 3E, a photoresist is applied and then exposed and developed to form a first region open mask 31, which covers the second region 202 and opens the first region 201. After the first region open mask 31 is formed, a dip-out process 32 is performed.

During the dip-out process 32, the isolation layer is entirely removed in the first region 201, but remains in the second region 202.

A wet dip-out process is applied as the dip-out process 32. Since the isolation layer is an oxide layer, a wet chemical such as hydrofluoric acid or BOE solution capable of wet-etching an oxide layer may be used in the wet dip-out process. At this time, since the buried guard ring 27 includes a nitride layer, the buried guard ring 27 is not removed during the wet dip-out process.

During the dip-out process 32, the buried guard ring 27 is not etched, but remains to prevent the wet chemical from flowing into the second region 202. Accordingly, a bunker is not formed in the second region during the dip-out process 32.

Figure 3F:
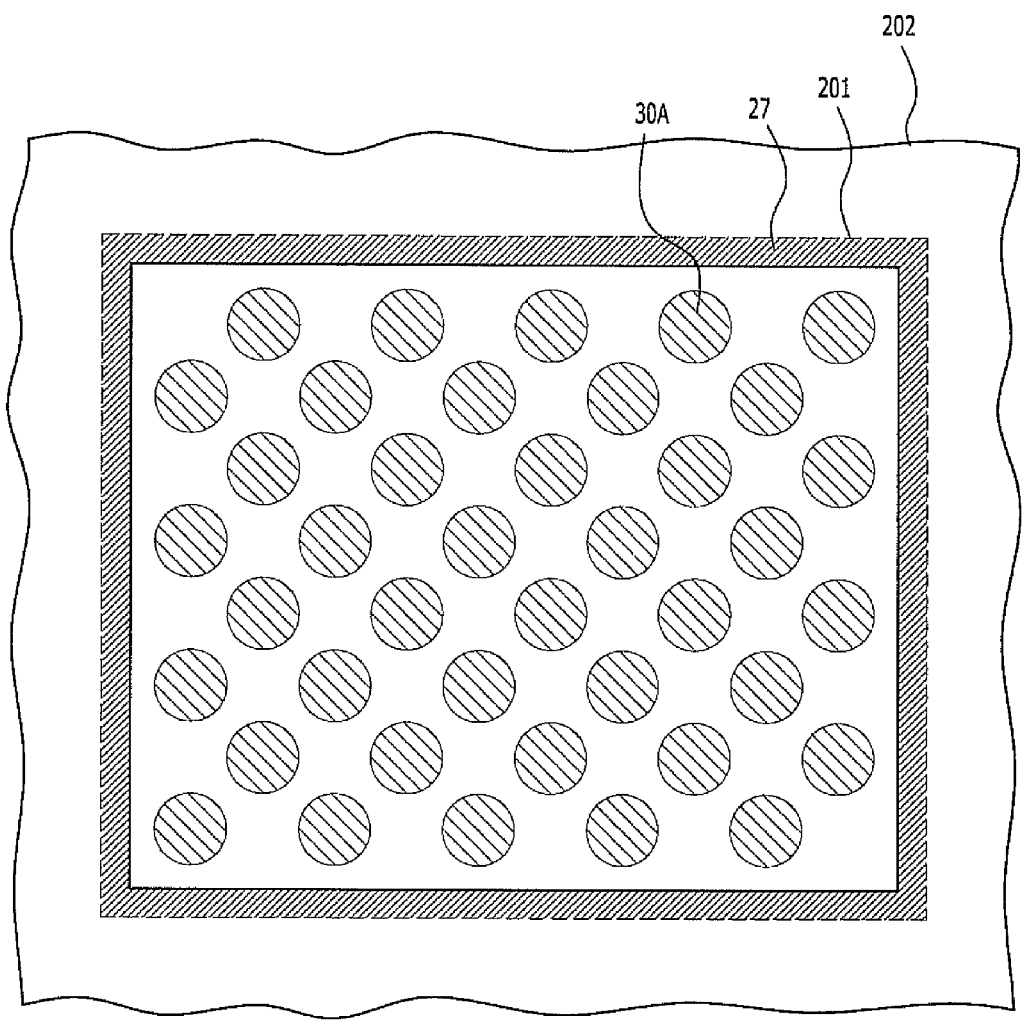
FIG. 3F is a plan view of the semiconductor device in accordance with the second embodiment of the present invention.

FIG. 3F is a plan view of the semiconductor device according to the second embodiment of the present invention, showing a state of the semiconductor device in which the buried guard ring 27 surrounds the edge of the first region 201 having the plurality of conductive patterns 30A formed therein. As such, since the buried guard ring 27 surrounds the first region 201, a bunker is not formed in the second region 202 during the dip-out process.

FIGS. 4A to 4F are cross-sectional views illustrating a method for fabricating a semiconductor device according to a third embodiment of the present invention.

Figure 4A:
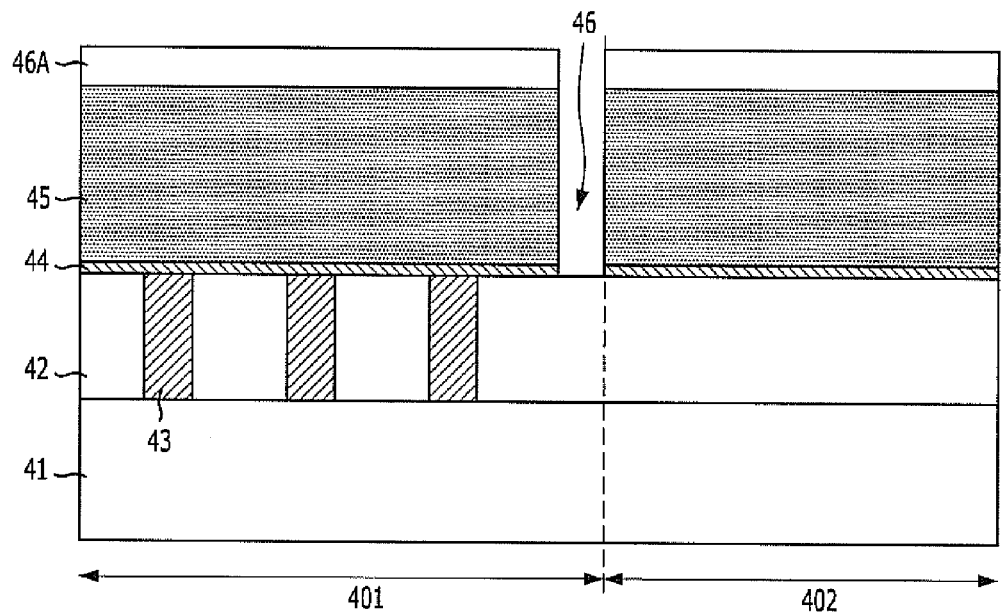
FIGS. 4A to 4F are cross-sectional views illustrating a method for fabricating a semiconductor device in accordance with a third embodiment of the present invention.

Referring to FIG. 4A, an interlayer dielectric layer 42 is formed on a semiconductor substrate 41 defining a cell region 401 and a peripheral circuit region 402. The cell region 401 and the peripheral circuit region 402 are regions which compose a memory device, such as DRAM.

A plurality of SNCs 43 are formed in the cell region 401 to pass through the interlayer dielectric layer 42. Although not shown, a process of forming a transistor, including a word line, and a process of forming a bit line may typically be performed before the SNCs 43 are formed. The interlayer dielectric layer 42 is formed of an oxide layer. The SNCs 43 are formed as follows. The interlayer dielectric layer 42 is etched using a storage node contact mask to form storage node contact holes, and a conductive layer, such as a polysilicon layer, is deposited and etched back to form the SNCs 43.

An etch stop layer 44 is formed on the interlayer dielectric layer 42 having the SNCs 43 buried therein. The etch stop layer 44 serves to stop etching when an isolation layer is etched. The etch stop layer 44 is formed of silicon nitride ($Si_3N_4$) to a thickness, of approximately 50 Å to approximately 2,000 Å.

A first isolation layer 45 is formed on the etch stop layer 44. The first isolation layer 45 is formed of an insulation layer. In particular, an oxide layer is deposited to such a thickness that an area required for desirable charge capacity may be secured. The first isolation layer 45 may be formed of an oxide layer, such as BPSG, PSG, TEAS, USG, or HDP. The first isolation layer 45 may have a thickness of approximately 100 Å to approximately 15,000 Å. After the first isolation layer 45 is formed, planarization may be performed by CMP, dry etching, or wet etching. The planarization thickness may range from approximately 50 Å to approximately 5,000 Å.

The first isolation layer 45 and the etch stop layer 44 are selectively dry-etched using a guard ring mask 46A to form a guard ring pattern 46. That is, the isolation layer 45 and the etch stop layer 44 are sequentially etched in the cell region 401 where the cell region 401 borders the peripheral circuit region 402 to form the guard ring pattern 46. The guard ring pattern 46 is a ring-type trench isolating the first isolation layer 45 on the cell region 401 from the first isolation layer 45 on the peripheral circuit region 402.

When the guard ring pattern 46 is formed using the guard ring mask 46A, i-line, KrF, or ArF (immersion) may be used as an exposure source. When the etching is performed, gases, including $C_xF_y$ (for example, $C_4F_5$), $C_xF_yCl_z$ (x ranges from 2 to 7; y ranges from 1 to 12; z ranges from 0 to 8; and y+z=2x−2), $O_2$, $O_3$ and so on, may be used independently or together.

Figure 4B:
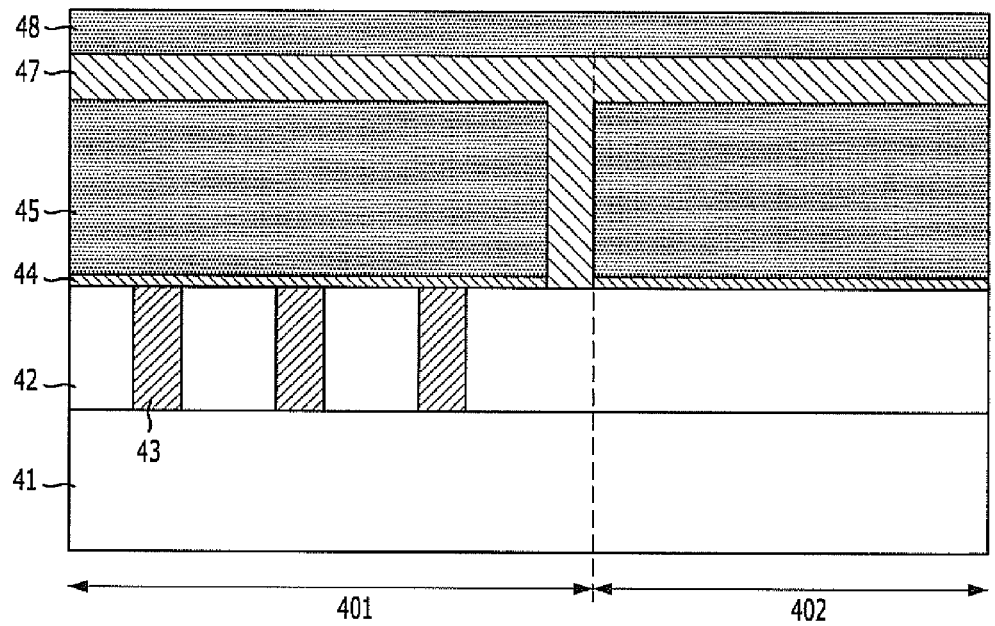

Referring to FIG. 4B, the guard ring mask 46A is removed, and a floating layer 47 is formed over a resulting structure until the guard ring pattern 46 is filled. The floating layer 47 includes a nitride layer. For example, a silicon nitride layer ($Ni_3N_4$) or silicon oxide nitride layer (SiON) may be used as the floating layer 47. While filling the guard ring pattern 46, the floating layer 47 is formed on the first isolation layer 45 to a thickness of approximately 50 Å to approximately 3,000 Å depending on the thickness and width of the guard ring pattern 46.

Since the floating layer 47 is formed to fill the guard ring pattern 46, a portion of the floating layer 47 filling the guard ring pattern 46 serves as a buried guard ring isolating the first isolation layer 45 on the cell region 401 from the first isolation layer 45 on the peripheral circuit region 402. When the floating layer 47 is a nitride layer, the floating layer 47 is referred to as a Nitride Floating Capacitor (NFC).

A second isolation layer 48 is formed on the floating layer 47. An oxide layer such as BPSG, PSG, TEOS, USG, or HDP may be used as the second isolation layer 48. The second isolation layer 48 may have a thickness of approximately 100 Å to approximately 2,000 Å. Alternatively, the second isolation layer 48 may be omitted.

Figure 4C:
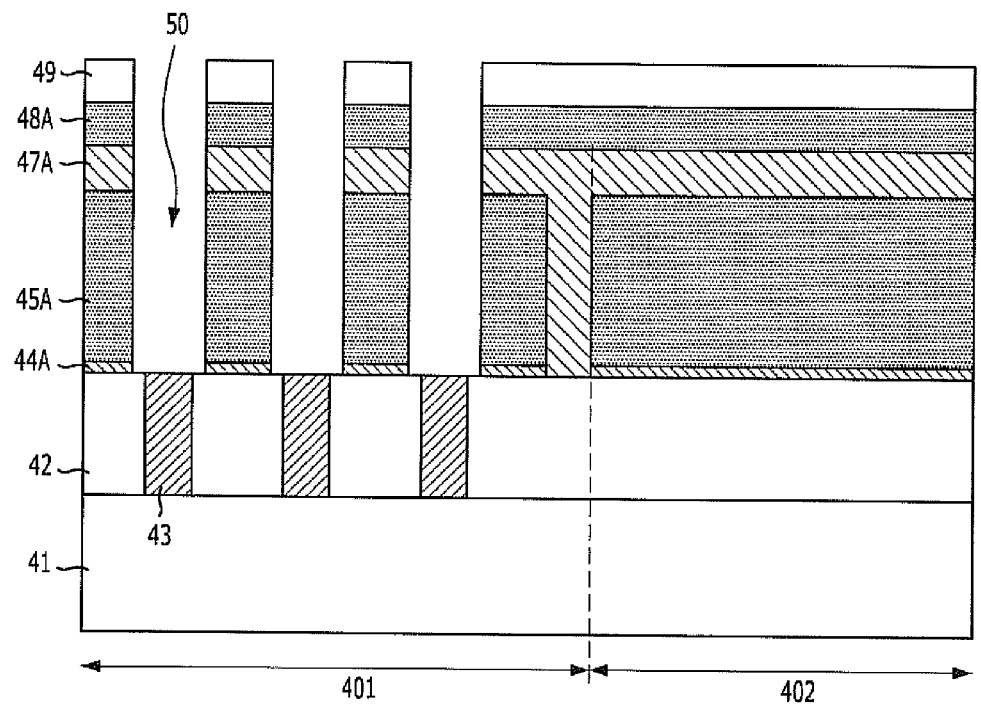

Referring to FIG. 4C, a photoresist is applied onto the second isolation layer 48 and patterned by exposure and development to form a storage node mask 49.

The second isolation layer 48, the floating layer 47, and the first isolation layer 45 are sequentially etched using the storage mask 49 as an etching barrier. The etch stop layer 44 is etched to form a plurality of storage node patterns 50 exposing the respective SNCs 43. The storage node patterns 50 are formed in the multilayer structure, including the etch stop layer 44A, the first isolation layer 45A, the floating 47A, and the second isolation 48A. The storage node patterns 50 are not formed at the border of the cell region 401 and the peripheral circuit 402.

In the third embodiment of the present invention, the guard ring pattern 46 is not formed at the same time when the storage node patterns 50 are formed. That is, the guard ring pattern 46 is previously formed and the guard ring pattern 46 is filled with the floating layer 47, before the storage node patterns 50 are formed.

Figure 4D:
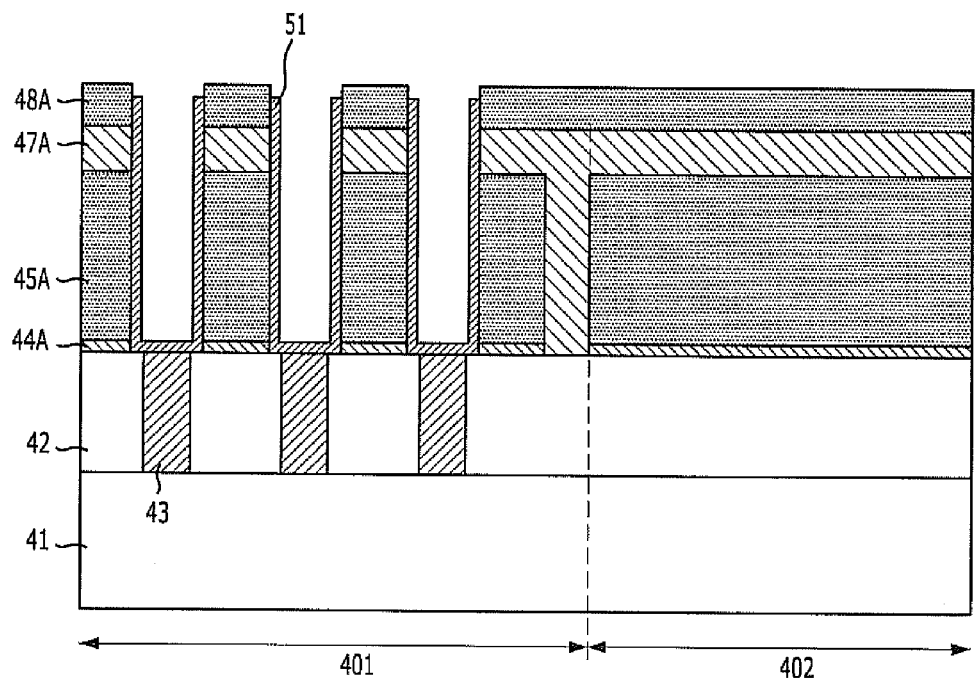

Referring to FIG. 4D, a plurality of cylinder-type storage nodes 51 are formed in the respective storage node patterns 50, after the storage node mask 49 is removed. The storage node 51 is formed as follows. A conductive layer is deposited over a resulting structure including the storage node patterns 50, and then etched back to form the storage nodes 51. The conductive layer used for the storage nodes 51 is formed of any one of a metal nitride layer, a metal layer, and a combination of metal nitride layer and metal layer. For example, at least any one of TiN, Ru, TaN, WN, Pt, and Ir may be used. The deposition and etch-back process of the conductive layer is referred to as a storage node isolation process.

Figure 4E:
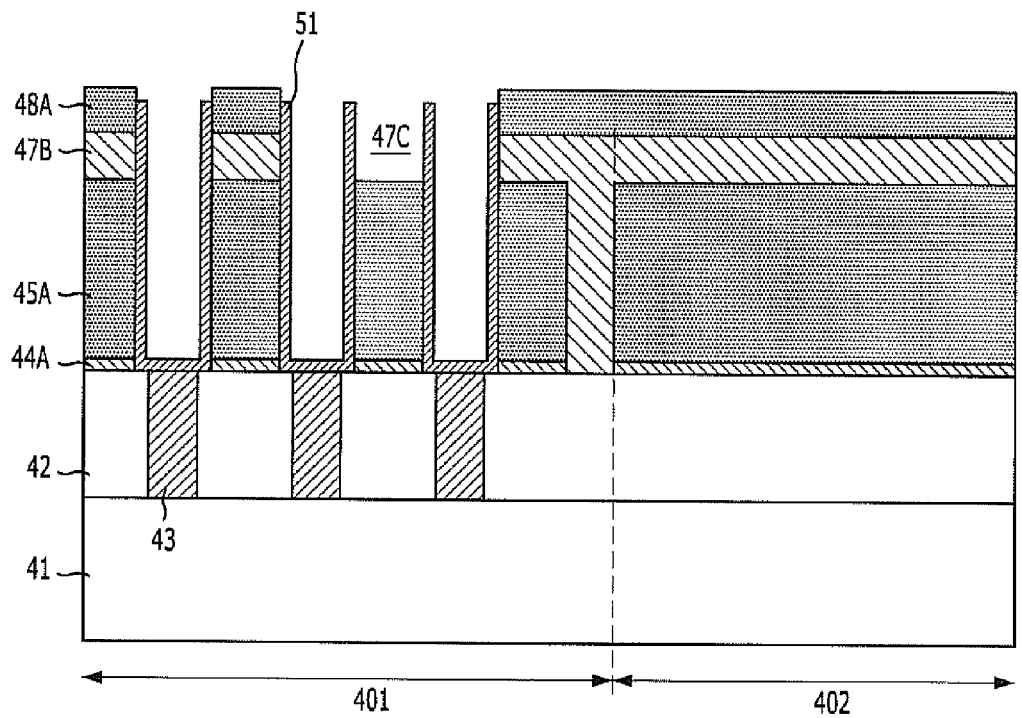

Referring to FIG. 4E, the floating layer 47A is partially etched. When the floating layer 47A is partially etched, the second isolation layer 48A on the floating layer 47A is first etched.

As the floating layer 47A is partially etched, a plurality of openings 47C into which a wet chemical flows during a subsequent dip-out process are formed in the floating layer 47B. The openings 47C formed in the floating layer 47B may have a shape illustrated in FIG. 4H. The openings 47C are arranged regularly and repeatedly. The openings 47C serve to cause a wet chemical to smoothly permeate the inside during a dip-out process.

When the floating layer 47A is partially etched, the etching is performed so as to obtain only a minimum number of openings 47C with a proper size are secured, in order to maintain the support performance of the floating layer 47B. When the number and size of the openings 47C becomes larger than needed, the support performance of the floating layer 47B is degraded.

Figure 4F:
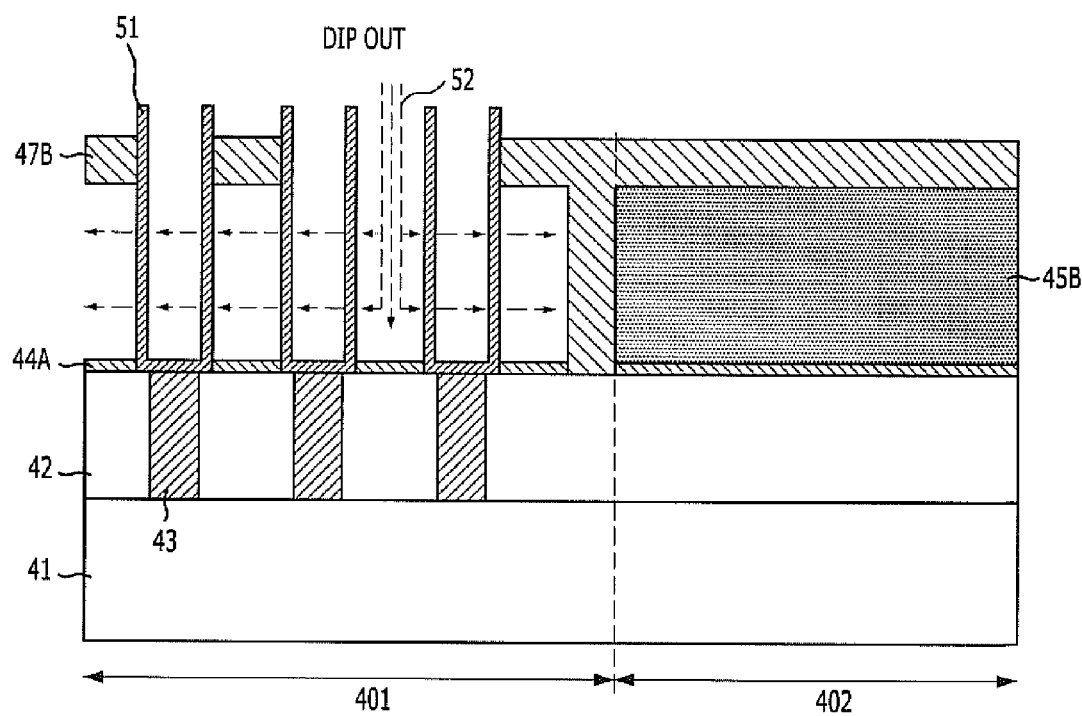

Referring to FIG. 4F, a dip-out process 52 is performed. During the dip-out process 52, the first and second isolation layers 45A and 48A are entirely removed in the cell region 401. In the peripheral circuit area 402, the second isolation layer 48A is removed, but the first isolation layer 45B remains.

A wet dip-out process 52 is applied as the dip-out process 52. Since the first and second isolation layers 45A and 48A are an oxide layer, a wet chemical, such as hydrofluoric acid or BOE solution, capable of wet-etching an oxide layer may be used in the wet dip-out process. The wet chemical flows into the openings 47C formed in the floating layer 47B to etch the isolation layers of the cell region 401. Since the floating layer 47B is a nitride layer, the floating layer 47B is not etched during the dip-out process 52, and the portion of the floating layer 47B buried in the guard ring pattern 46 prevents the wet chemical from flowing into the peripheral circuit region 402. As the floating layer 47B is used, a process of forming a mask, which covers the peripheral circuit region 402 and opens the cell region 401, need not be performed.

During the dip-out process 42, the floating layer 47B is not etched, but remains to securely support the storage nodes 51 such that the storage nodes 51 do not fall down. The etch stop layer 44A prevents the wet chemical from permeating into the structure under the storage nodes 51. When the floating layer 47B is a nitride layer, the floating layer 47B is referred to as an NFC.

Figure 4G:
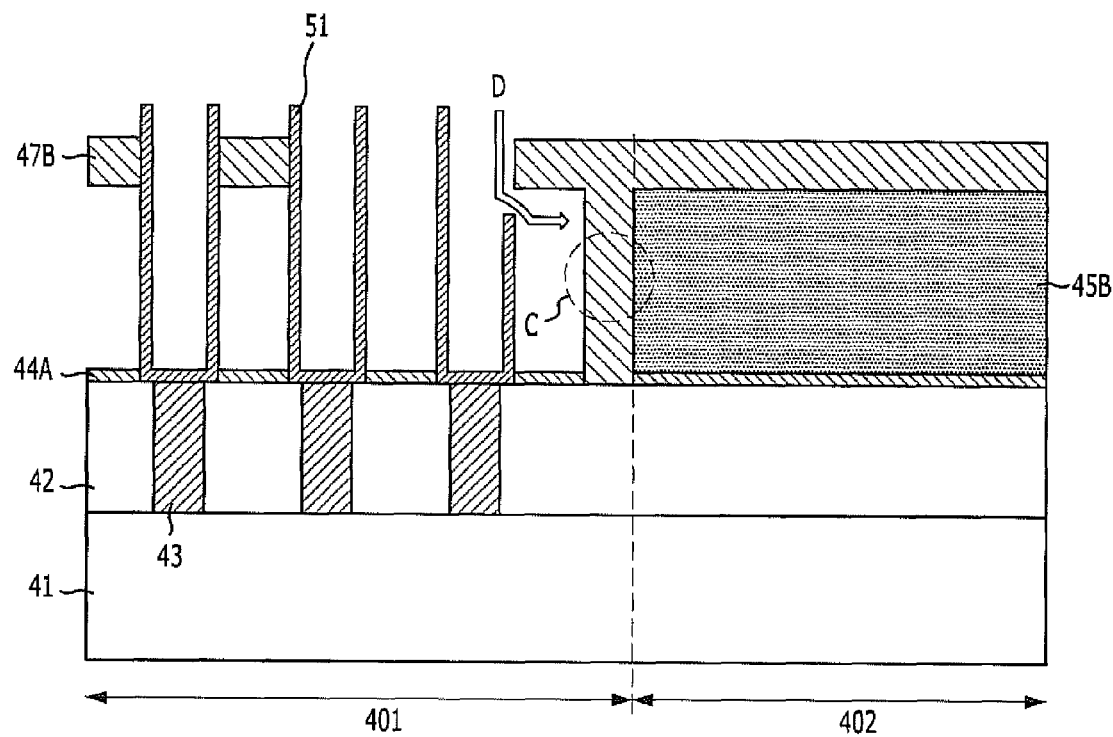
FIG. 4G is a diagram showing a case in which an upper portion of a storage node is damaged.

FIG. 4G is a diagram illustrating a case in which an upper portion of a storage node 51 is damaged during the etch-back process for forming the storage nodes 51. Although the upper portion of the storage node 51 is damaged, the inside of the guard ring pattern 46 is filled with the floating layer 47B (marked as region C). Therefore, the floating layer 47B serves as a protective layer. That is, although the upper portion of the storage node 51 around the guard ring pattern 46 is excessively damaged, a bunker by the wet chemical (refer to reference numeral D) is not formed in the peripheral circuit region 402, because the wet chemical D used during the dip-out process 52 does not pass through the floating layer 47B buried in the guard ring pattern 46.

Figure 4H:
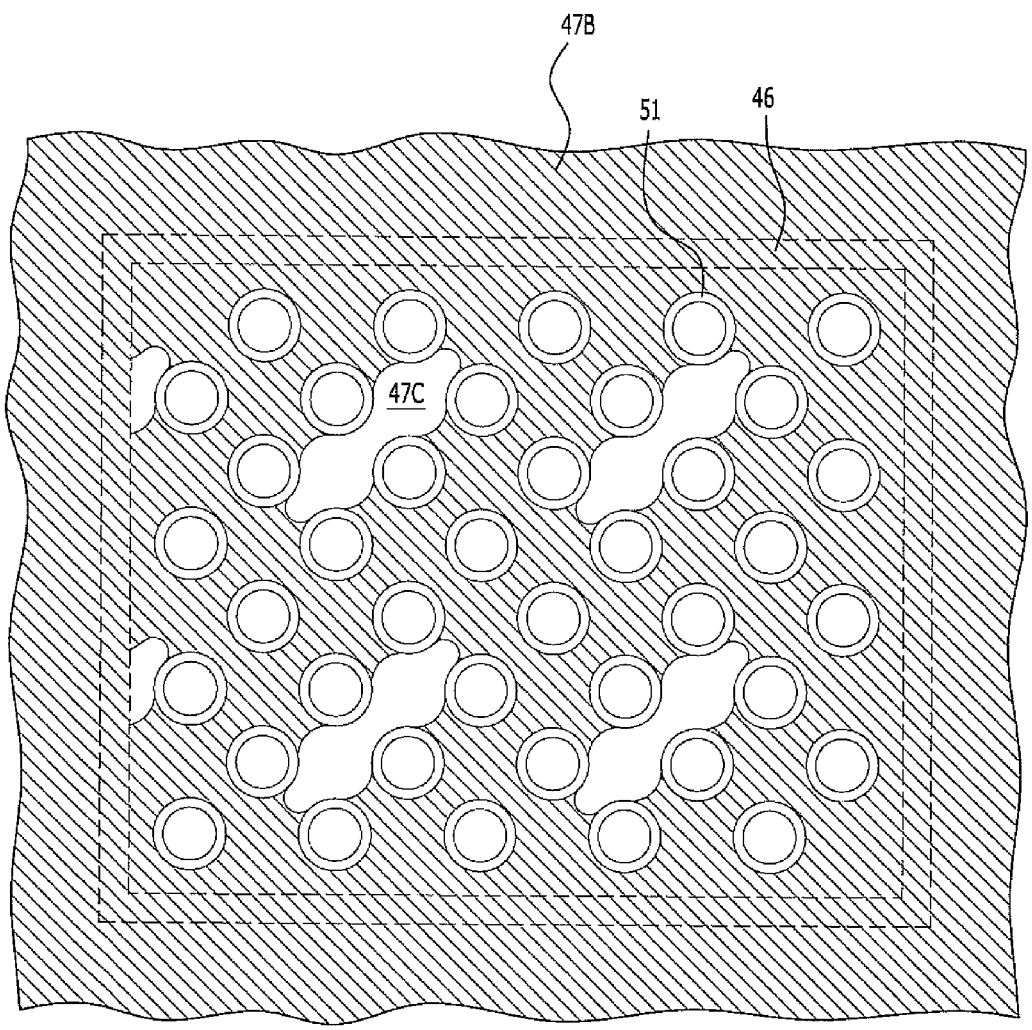
FIG. 4H is a plan view of the semiconductor device in accordance with the third embodiment of the present invention.

FIG. 4H is a plan view of the semiconductor device in accordance with the third embodiment of the present invention.

Referring to FIG. 4H, the floating layer 47B fixing side walls of the neighboring storage nodes 51 has the openings 47C formed in predetermined regions. The openings 47C may be arranged in a regular and repeated manner and formed in a peanut shape. As described above, the openings 47C serve to provide a permeation path of the wet chemical during the dip-out process. It can be seen that the side walls of six neighboring storage nodes are exposed through each of the openings 47C. The number of the storage nodes 51 exposed through each of the openings 47C may be equal to or more than six. The number and size of the openings 47C provided in the floating layer 47B are not limited. A minimum number of openings 47C with a minimum size may be formed as long as they can provide permeation paths of the wet chemical.

Since the floating layer 47B has an integrated form to support the side walls of the neighboring storage nodes, the floating layer 47B may support the neighboring storage nodes more securely, making it possible to prevent the adjacent storage nodes 51 from leaning during the dip-out process.

A portion of the floating layer 47B fills the guard ring pattern 46, and thus serves as a guard ring surrounding the cell region 401.

FIGS. 5A to 5F are cross-sectional views illustrating a method for fabricating a capacitor in accordance with a fourth embodiment of the present invention.

Figure 5A:
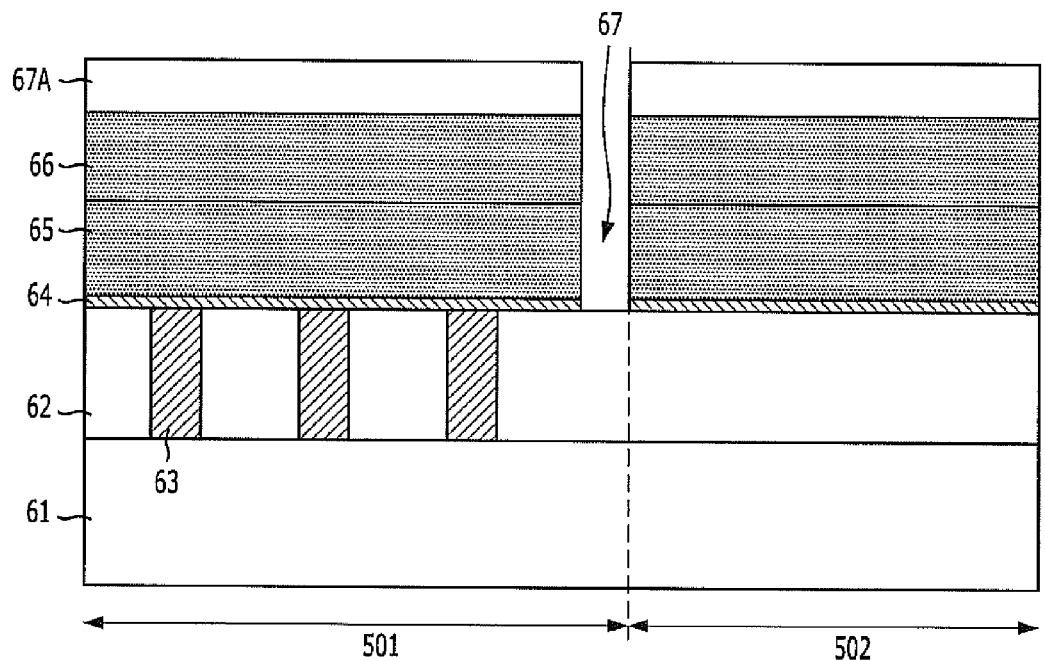
FIGS. 5A to 5F are cross-sectional views illustrating a method for fabricating a semiconductor device in accordance with a fourth embodiment of the present invention.

Referring to FIG. 5A, an interlayer dielectric layer 62 is formed on a semiconductor substrate 61 defining a cell region 501 and a peripheral circuit region 502. The cell region 501 and the peripheral circuit region 502 are regions which compose a memory device, such as DRAM.

A plurality of SNCs 63 are formed in the cell region 501, so as to pass through the interlayer dielectric layer 62. Although not shown, a process of forming a transistor, including a word line, and a process of forming a bit line may typically be performed before the SNCs 63 are formed. The interlayer dielectric layer 62 is formed of an oxide layer. The SNCs 63 are formed as follows. The interlayer dielectric layer 62 is etched to form a plurality of storage node contact holes, and a conductive layer, such as a polysilicon layer, is deposited and etched back to form the SNCs 63.

An etch stop layer 64 is formed on the interlayer dielectric layer 62 having the SNCs 63 buried therein. The etch stop layer 64 serves to stop etching when isolation layers are etched. The etch stop layer 64 may be formed of silicon nitride ($Si_3N_4$).

First and second isolation layers 65 and 66 are sequentially formed on the etch stop layer 64. The first and second isolation layers 65 and 66 are formed of an insulation layer. In particular, an oxide layer is deposited to such a thickness that an area required for desirable charge capacity may be obtained. The first and second isolation layers 65 and 66 may be formed of an oxide layer, such as BPSG, PSG, TEOS, USG, or HDP. The first and second isolation layers 65 and 66 may be formed of materials having a different wet etching speed for the same wet etching solution. For example, the first isolation layer 65 is formed of a material having a relatively high wet etching speed, and the second isolation layer 66 is formed of a material having a lower wet etching speed than the first isolation layer 65. Examples of the material having a high wet etching speed may include BPSG, SOD, and PSG, and examples of the material having a lower wet etching speed may include a low pressure tetraethylorthosilicate (LP-TEOS) and a plasma enhanced tetraethylorthosilicate (PE-TEOS). Therefore, the first isolation layer 65 may include BPSG, SOD, or PSG, and the second isolation layer 66 may include LPTEOS or PETEOS. Such a difference in wet etching speed is caused by an oxide layer etching solution. Examples of the oxide layer etching solution may include a hydrofluoric acid solution and a BOE solution.

The total thickness of the first and second isolation layers 65 and 66 may range from approximately 100 Å to approximately 15,000 Å. After the first and second isolation layers 65 and 66 are formed, planarization may be performed by CMP, dry etching, or wet etching. The planarization thickness may range from approximately 50 Å to approximately 5,000 Å.

The first and second isolation layers 65 and 66 are selectively dry-etched using a guard ring mask 67A to form a guard ring pattern 67. That is, the first and second isolation layers 65 and 66 and the etch stop layer 64 are sequentially etched at the border of the cell region 501 and the peripheral circuit region 502 to form the guard ring pattern 67. The guard ring pattern 67 is a ring-type trench surrounding the cell region 501.

When the guard ring pattern 67 is formed using the guard ring mask 67A, i-line, KrF, or ArF immersion may be used as an exposure source. When the etching is performed, gases, including $C_xF_y$ (for example, $C_4F_8$), $C_xF_yCl_z$ (x ranges from 2 to 7; y ranges from 1 to 12; z ranges from 0 to 8; and y+z=2x−2), $O_2$, $O_3$ and so on, may be used independently or together.

Figure 5B:
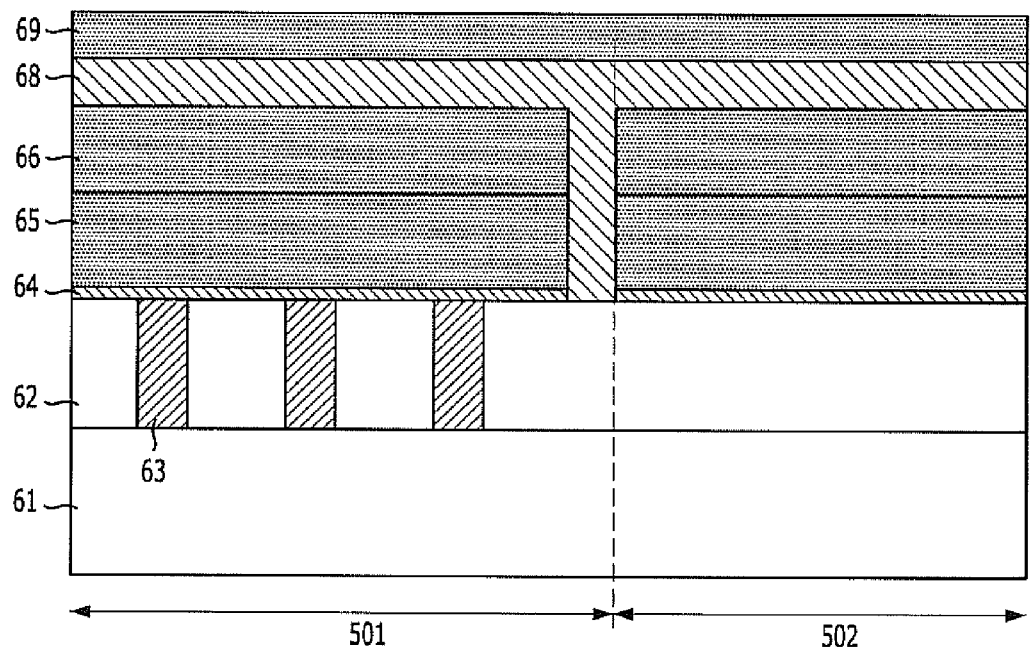

Referring to FIG. 5B, the guard ring mask 67A is removed, and a floating layer 68 is formed over a resulting structure until the guard ring pattern 67 is completely filled. The floating layer 68 includes a nitride layer. For example, a silicon nitride layer ($Ni_3N_4$) or silicon oxide nitride layer (SiON) may be used as the floating layer 68. While filling the guard ring pattern 67, the floating layer 68 is formed on the second isolation layer 66 to a thickness of approximately 50 Å to approximately 3,000 Å depending on the depth and width of the guard ring pattern 67.

Since the floating layer 68 is formed to fill the guard ring pattern 67, a portion of the floating layer 68 filling the guard ring pattern 67 serves as a buried guard ring isolating the first and second isolation layers 65 and 66 on the cell region 501 from the first and second isolation layers 65 and 66 on the peripheral circuit region 502. When the floating layer 68 is a nitride layer, the floating layer 68 is referred to as an NFC.

A third isolation layer 69 is formed on the floating layer 68. The third isolation layer 69 includes an insulation layer and is formed of the same material as the second isolation layer 66. For example, the third isolation layer 69 includes LPTEOS or PETEOS having a low wet etching speed.

Figure 5C:
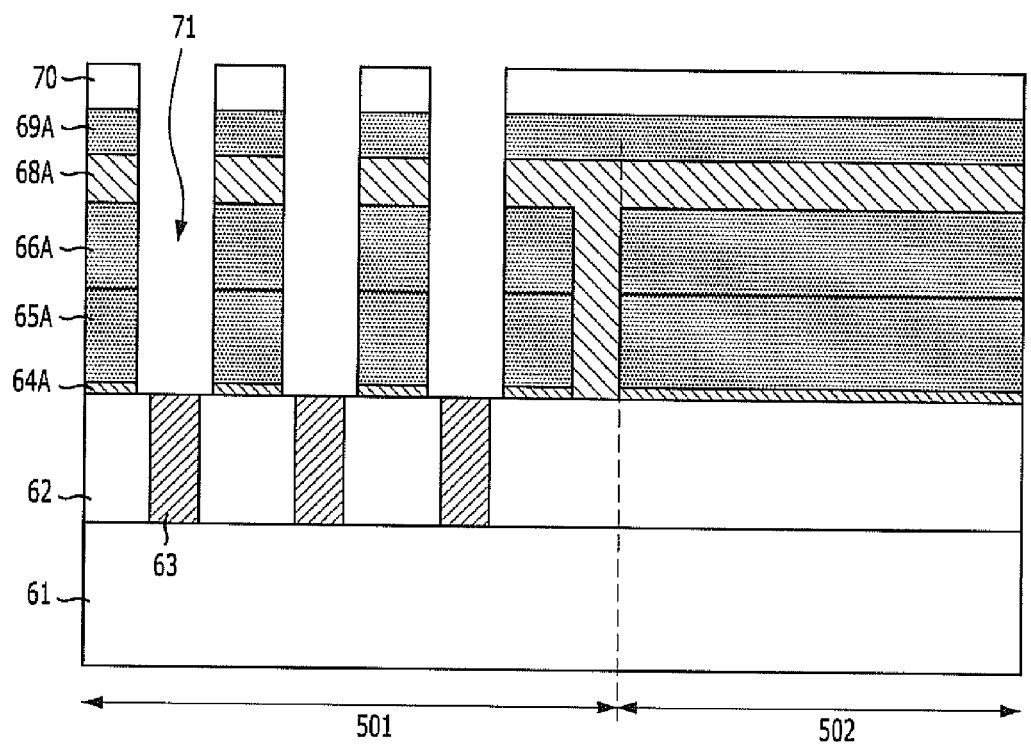

Referring to FIG. 5C, a photoresist is applied onto the third isolation layer 69 and then patterned by exposure and development to form a storage node mask 70.

The third isolation layer 69, the floating layer 68, the second isolation layer 66, and the first isolation layer 65 are sequentially etched using the storage node mask 70 as an etching barrier. The etch stop layer 64 is etched to form a plurality of storage node patterns 71 exposing the respective SNCs 63. The storage node patterns 71 are formed in the multilayer structure, including the etch stop layer 64A, the first isolation layer 65A, the second isolation layer 66A, the floating layer 68A, and the third isolation layer 69A. The storage node patterns 71 are not formed at the border of the cell region 501 and the peripheral circuit region 502.

In the fourth embodiment of the present invention, the guard ring pattern 67 is not formed at the same time when the storage node patterns 71 are formed. That is, after the guard ring pattern 67 is previously formed and the guard ring pattern 67 is filled with the floating layer 68, the storage node patterns 71 are formed.

Figure 5D:
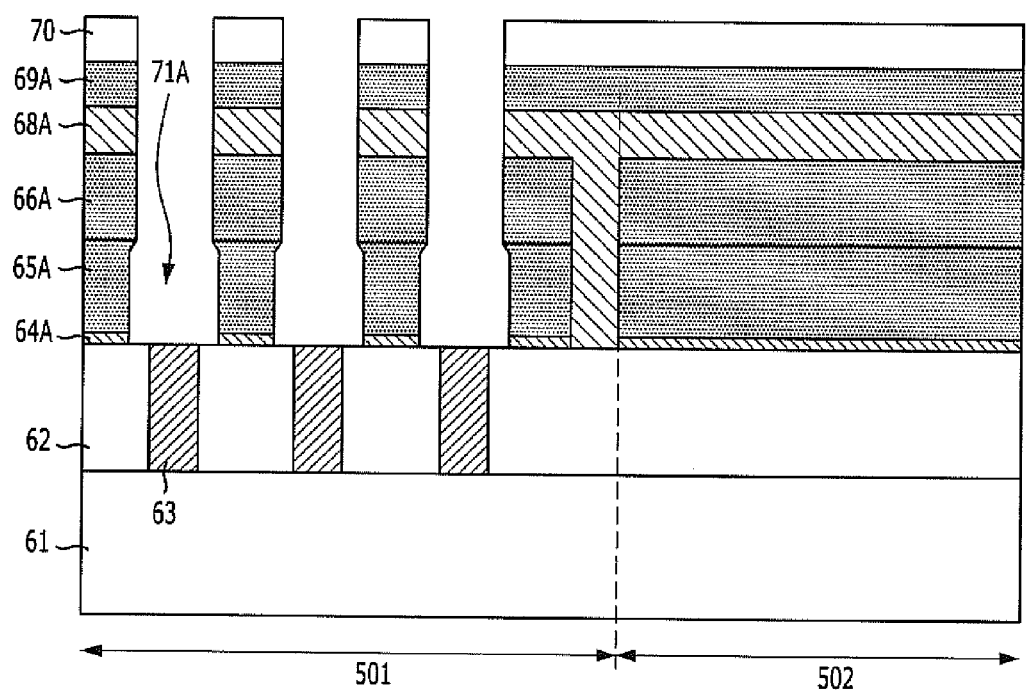

Referring to FIG. 5D, wet etching is performed. Then, lower portions of the storage node patterns 71 are widened. Since the first to third isolation layers 65A, 66A, and 69A are formed of an oxide layer, the wet etching is performed using an oxide layer etching solution. Therefore, the first to third isolation layers 65A, 66A, and 69A are etched. The first isolation layer 65A having a relatively high wet etching speed is etched more quickly than the second and third isolation layers 66A and 69A. That is, the second and third isolation layers 66A and 69A are barely etched if at all, while the first isolation layer 65A is etched. Furthermore, the floating layer 68A formed of a nitride layer is not etched. Accordingly, the storage node patterns 71A of which the lower portions are widened are formed.

Figure 5E:
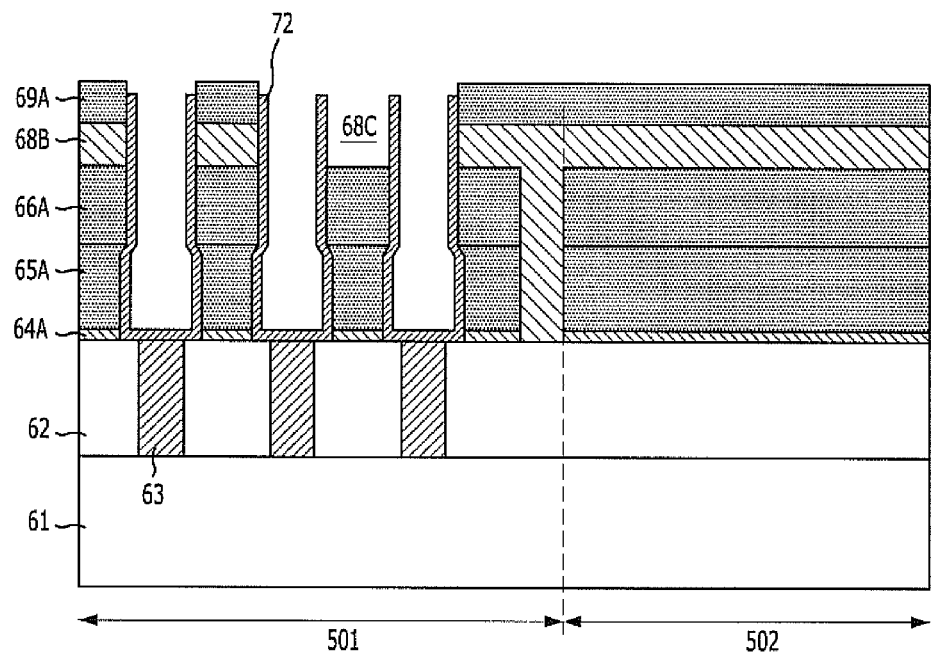

Referring to FIG. 5E, a plurality of cylinder-type storage nodes 72 are formed in the respective storage node patterns 71A after the storage node mask 70 is removed. The storage nodes 72 are formed as follows. A conductive layer is deposited over a resulting structure, including the storage node patterns 71A, and then etched back to form the storage nodes 72. The conductive layer used for the storage nodes 72 is formed of at least any one of a metal nitride layer, a metal layer, and a combination of metal nitride layer and metal layer. For example, any one of TiN, Ru, TaN, WN, Pt, and Ir may be used. The deposition and etch-back process of the conductive layer is referred to as a storage node isolation process.

The floating layer 68A is partially etched. When the floating layer 68A is partially etched, the third isolation layer 69A on the floating layer 68A is first etched. Reference numeral 68B represents the etched floating layer.

As the floating layer 68A is partially etched in such a manner, a plurality of openings 68C are formed, into which a wet chemical may flow during a subsequent dip-out process. The openings 68C formed in the floating layer 68B may have a shape as illustrated in FIG. 4H. Further, the openings 68C may be arranged in a regular and repeated manner. The openings 68C serve to allow a wet chemical to smoothly permeate the inside during the dip-out process.

When the floating layer 68A is partially etched, the etching may be performed to obtain a minimum number of openings 68C, such that adequate support provided by the floating layer 68B is maintained. When the number and size of the openings 68C become larger than need, the support performance of the floating layer 68B is degraded.

Figure 5F:
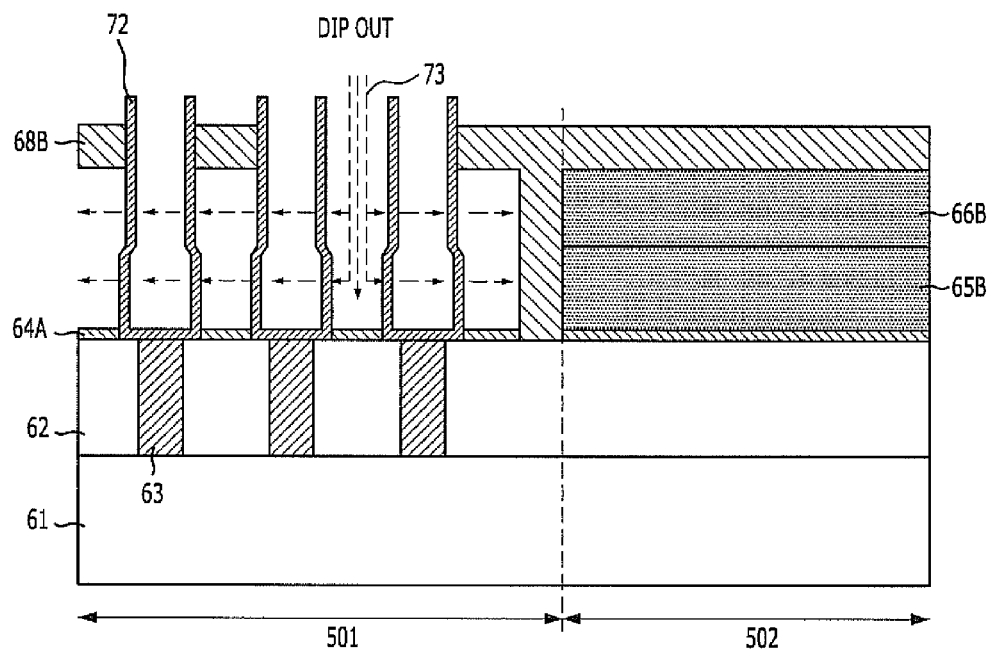

Referring to FIG. 5F, a dip-out process 73 is performed. During the dip-out process 73, the first to third isolation layers 65A, 66A, and 69A are all removed in the cell region 501. In the peripheral circuit region 502, however, the third isolation layer 69A is removed, but the first and second isolation layers 65B and 66B remain.

A wet dip-out process is applied as the dip-out process 73. Since the first to third isolation layers 65A, 66A, and 69A are each formed of an oxide layer, a wet chemical, such as hydrofluoric acid or BOE solution, capable of wet-etching an oxide layer may be used in the wet dip-out process. The wet chemical flows into the openings 68C formed in the floating layer 68B to etch the isolation layers. Since the floating layer 68B is a nitride layer, the floating layer 68B is not etched during the dip-out process 73. As the floating layer 68B is used, a process of forming a mask, which covers the peripheral circuit region and opens the cell region, need not be performed.

During the dip-out process 73, the floating layer 68B is not etched, but remains to securely support the storage nodes 72, such that the storage nodes 72 do not fall down. The etch stop layer 64A prevents the wet chemical from permeating into the structure under the storage nodes 51.

In accordance with the fourth embodiment of the present invention, although an upper portion of a storage node 72 adjacent to the guard ring pattern 67 may be damaged, the inside of the guard ring pattern 67 is completely filled with the floating layer 68B. Therefore, the floating layer 68B may serve as a protective layer. That is, although an upper portion of a storage node 72 around the guard ring pattern 67 may be excessively damaged, a bunker by the wet chemical is not formed in the peripheral circuit region 502, because the wet chemical used in the dip-out process 73 does not pass through the floating layer 68B buried in the guard ring pattern 67.

This embodiment of the present invention may be applied to a capacitor adopting pillar-type storage nodes.

Figure 6:
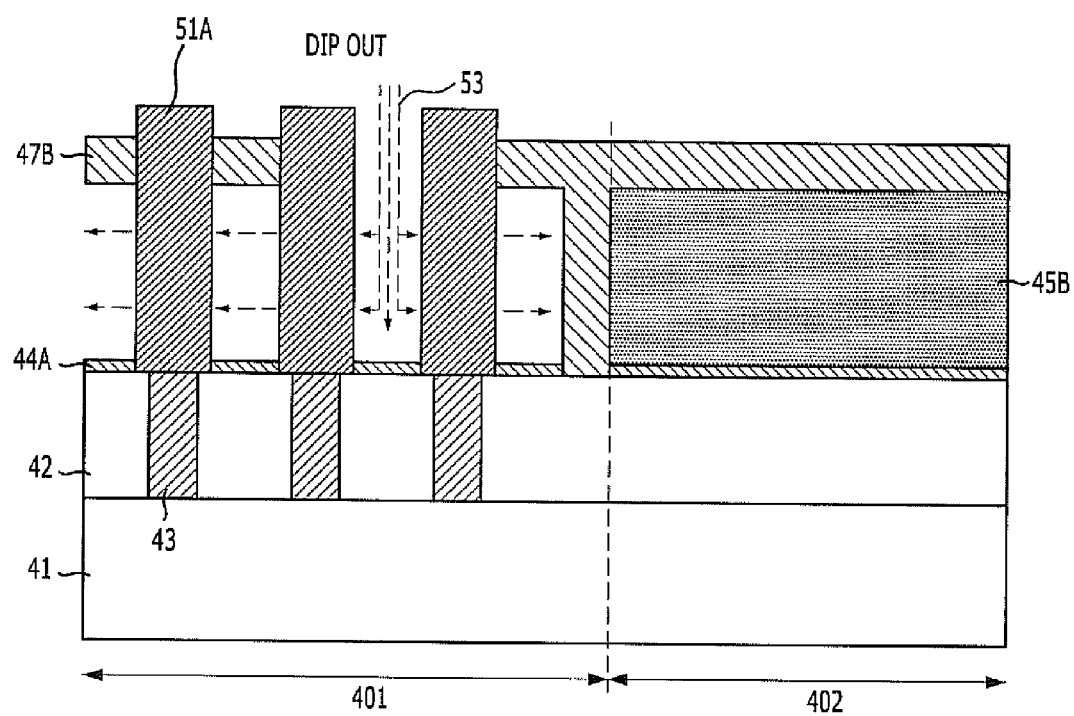
FIG. 6 is a diagram illustrating a method for fabricating a semiconductor device in accordance with a modification of the third embodiment of the present invention.

FIG. 6 is a diagram illustrating a method for fabricating a semiconductor device in accordance with a modification of the third embodiment of the present invention. As illustrated in FIG. 4C, a plurality of storage node patterns 50 are formed. However, as shown in FIG. 6, the third embodiment may be modified by forming a plurality of storage node nodes 51A filling the storage node patterns 50. The subsequent procedures are performed in the same manner as in the third embodiment until the dip-out process 53.

Figure 7:
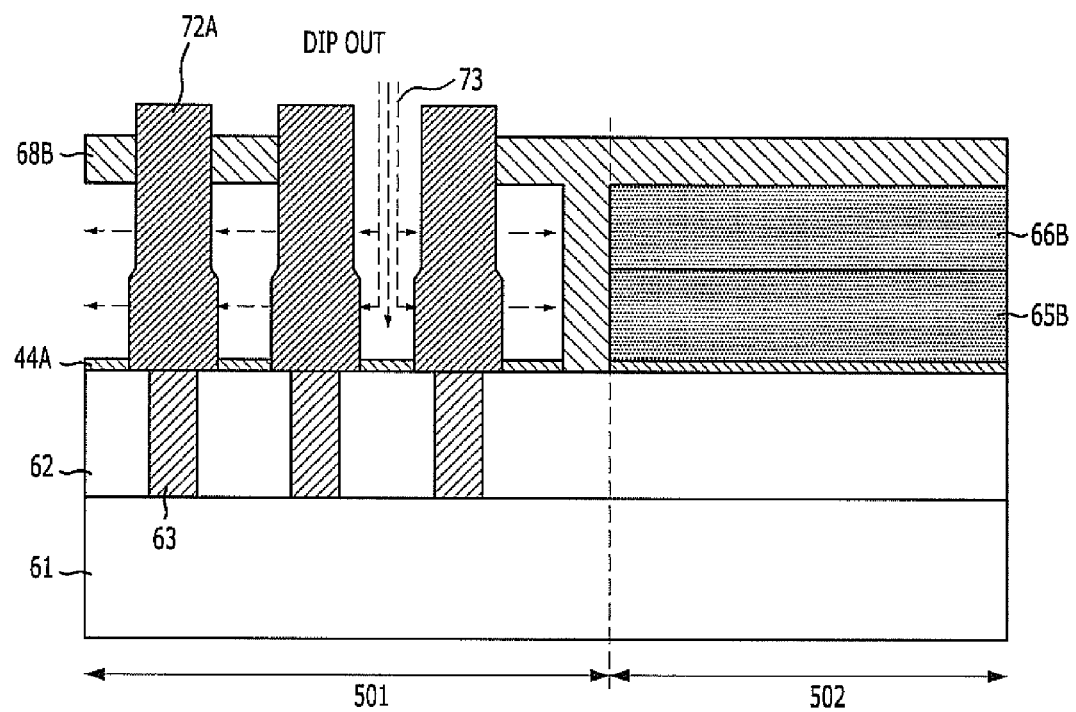
FIG. 7 is a diagram illustrating a method for fabricating a semiconductor device in accordance with a modification of the fourth embodiment of the present invention.

FIG. 7 is a diagram illustrating a method for fabricating a semiconductor device in accordance with a modification of the fourth embodiment of the present invention. Referring to FIG. 5D, a plurality of storage node patterns 71A whose lower portions are widened are formed. However, as shown in FIG. 7, the fourth embodiment may be modified by forming a plurality of pillar-type storage nodes 72A filling the storage node patterns 71A. The subsequent procedures are performed in the same manner as in the third embodiment until the dip-out process 73.

In accordance with the embodiments of the present invention, as the floating layer is formed to fill the inside of the guard ring pattern surrounding the cell region, the peripheral circuit region is protected by the floating layer during the dip-out process. Therefore, it is easy to secure the margin of the guard ring pattern, and it is possible to prevent a bunker from being formed in the peripheral circuit region.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming an isolation layer over a semiconductor substrate defining first and second regions;
   etching the isolation layer at an edge of the first region to form a guard ring pattern;
   forming a buried guard ring filling the guard ring pattern;
   selectively etching the isolation layer of the first region to form a plurality of patterns after the buried guard ring is formed;
   forming a plurality of conductive patterns in the respective patterns; and
   completely removing the isolation layer of the first region through a dip-out process.

2. The method of claim 1, wherein the guard ring pattern comprises a ring type trench surrounding the first region.

3. The method of claim 1, wherein the buried guard ring comprises an insulation layer.

4. The method of claim 1, wherein the isolation layer comprises an oxide layer, and the buried guard ring comprises a nitride layer.

5. The method of claim 1, wherein the patterns have a hole shape.

6. The method of claim 1, wherein the conductive patterns comprise cylinder-type storage nodes or pillar-type storage nodes.

7. The method of claim 1, wherein a wet dip-out process is performed as the dip-out process.

8. The method of claim 1, wherein the first region comprises a cell region of a memory device, and the second region comprises a peripheral circuit region and a core region of the memory device.

9. A method for fabricating a semiconductor device, comprising:
   forming an isolation layer over a semiconductor substrate defining a cell region and a peripheral circuit region;
   etching the isolation layer at an edge of the cell region to form a guard ring pattern;
   forming a floating layer over the isolation layer, the floating layer having a portion which is buried in the guard ring pattern to serve as a guard ring;
   selectively etching the floating layer and the isolation layer of the cell region to form a plurality of storage node patterns;
   forming a plurality of storage nodes in the respective storage node patterns; and
   completely removing the isolation layer of the cell region through a dip-out process.

10. The method of claim 9, further comprising, partially etching the floating layer to form a plurality of openings each of which opens a space among the neighboring storage nodes, before the removing of the isolation layer.

11. The method of claim 9, wherein the guard ring pattern is a ring type trench surrounding the cell region.

12. The method of claim 9, wherein the floating layer comprises an insulation layer.

13. The method of claim 9, wherein the isolation layer comprises an oxide layer, and the floating layer comprises a nitride layer.

14. The method of claim 9, wherein the storage node patterns have a hole shape.

15. The method of claim 9, wherein the storage node patterns have a lower portion formed in a wide hole shape.

16. The method of claim 9, wherein the storage nodes comprise cylinder-type storage nodes or pillar-type storage nodes.

17. The method of claim 9, wherein the dip-out process is performed using a wet dip-out process.

* * * * *